US008558253B2

(12) United States Patent
Omoto

(10) Patent No.: US 8,558,253 B2
(45) Date of Patent: Oct. 15, 2013

(54) ORGANIC EL DISPLAY DEVICE AND ELECTRONIC APPARATUS

(75) Inventor: Keisuke Omoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 51 days.

(21) Appl. No.: 13/305,324

(22) Filed: Nov. 28, 2011

(65) Prior Publication Data

US 2012/0175645 A1 Jul. 12, 2012

(30) Foreign Application Priority Data

Jan. 6, 2011 (JP) ................................ 2011-000942

(51) Int. Cl.
*H01L 27/32* (2006.01)

(52) U.S. Cl.
USPC .......... 257/88; 257/40; 257/E27.119; 257/89; 345/206

(58) Field of Classification Search
None
See application file for complete search history.

(56) References Cited

U.S. PATENT DOCUMENTS 6,002,462 A * 12/1999 Sato et al. .................... 349/106
6,046,547 A * 4/2000 Nishio et al. ............... 315/169.3
6,075,580 A * 6/2000 Kouchi ......................... 349/110
6,677,613 B1 * 1/2004 Yamazaki et al. .............. 257/72
7,379,149 B2 * 5/2008 Kim et al. ..................... 349/158
7,723,725 B2 * 5/2010 Yamazaki et al. .............. 257/59
7,915,615 B2 * 3/2011 Yamazaki et al. .............. 257/59
7,944,416 B2 * 5/2011 Ono et al. ....................... 345/77
8,345,032 B2 * 1/2013 Tomida et al. ................ 345/211
2005/0012097 A1 * 1/2005 Yamazaki ....................... 257/59
2005/0057182 A1 * 3/2005 Shibusawa ................ 315/209 R
2007/0102737 A1 5/2007 Kashiwabara et al.
2009/0046040 A1 2/2009 Iida et al.
2009/0057669 A1 * 3/2009 Ishii ................................ 257/59
2009/0315918 A1 * 12/2009 Minami et al. ................ 345/690
2010/0149146 A1 * 6/2010 Yamashita et al. ............ 345/207
2010/0156860 A1 * 6/2010 Yamamoto et al. ........... 345/205
2010/0176400 A1 * 7/2010 Asano et al. .................... 257/59
2010/0177126 A1 * 7/2010 Inoue et al. ................... 345/690

FOREIGN PATENT DOCUMENTS

JP 2006-133542 5/2006
JP 2007-310311 11/2007
JP 2009-047764 3/2009

* cited by examiner

*Primary Examiner* — Thomas L Dickey
*Assistant Examiner* — Joseph Schoenholtz
(74) *Attorney, Agent, or Firm* — Rader, Fishman & Grauer PLLC

(57) ABSTRACT

An organic EL display device includes organic EL elements provided for respective pixels. Each organic EL element has first and second electrodes between which an organic layer is provided and has a region that contributes to light emission and a region that does not contribute to light emission. A capacitor is formed between the first and second electrodes in the region that does not contribute to light emission and is used as a capacitance element in a drive circuit for the organic EL element.

20 Claims, 21 Drawing Sheets

BEFORE $t=t_{11}$ $t=t_{11}$ $t=t_{12}$ $t=t_{13}$ $t=t_{14}$ $t=t_{15}$ $t=t_{16}$ $t=t_{17}$ 142
141

142
143
141

143
141
147
146
145

141
142

141
142

141
142

141
142
144

ORGANIC EL DISPLAY DEVICE AND ELECTRONIC APPARATUS

BACKGROUND

The present disclosure relates to an organic EL display device and an electronic apparatus.

As one example of flat (flat-panel) display devices, there is a display device using, as light emitting sections (light emitting elements) for pixels, current-driven electro-optical elements having light-emission luminances that vary in accordance with the values of currents flowing through the elements. As the current-driven electro-optical elements, organic EL (electroluminescent) elements that utilize electroluminescence of organic material are available. The organic EL elements utilize the phenomenon of emitting light when an electric field is applied to an organic thin film.

A typical organic EL display device using the organic EL elements as light emitting sections for the pixels has the following features. The organic EL elements can be driven with a voltage of 10 V or less and thus are low in power consumption. Since the organic EL elements are self-light-emitting elements, visibility of an image is high compared to a liquid-crystal display device. Furthermore, since the organic EL elements do not employ a lighting component, such as a backlight, reductions in weight and thickness can be easily achieved. In addition, since the response speed of the organic EL elements is quite high, typically, on the order of several microseconds, no afterimage appears during display of a moving image.

Organic EL display devices can employ a simple (passive) matrix system or an active matrix system as its drive system, as in the liquid-crystal display devices. For the active matrix display device, since the electro-optical elements continuously emit light throughout one display-frame period, it is easy to achieve a large-sized, high-definition display device, compared to the simple matrix display device.

The active matrix organic EL display device uses active elements (e.g., insulated-gate field effect transistors) provided in the organic EL elements to control current flowing in the EL elements. As the insulated-gate field effect transistors, TFTs (thin film transistors) are used in general. That is, drive circuits (pixel circuit) for the organic EL elements provided for the pixels are configured using TFTs.

More specifically, the drive circuit of each pixel includes a write transistor for writing a signal voltage of a video signal, a storage capacitor for storing the signal voltage written by the write transistor, and a drive transistor for driving an organic EL element in response to the voltage stored by the storage capacitor (see, e.g., Japanese Unexamined Patent Application Publication No. 2007-310311). In order to compensate for a shortage of capacitance components of the organic EL element, an auxiliary capacitor may be provided for each pixel (see, e.g., Japanese Unexamined Patent Application Publication No. 2009-047764). In addition, depending on the configuration of a pixel circuit, there are also cases in which the number of transistors and capacitance elements further increase (see, e.g., Japanese Unexamined Patent Application Publication No. 2006-133542).

SUMMARY

As described above, in the organic EL display device, at least one capacitance element (storage capacitor) is typically provided for each pixel and two or more capacitance elements are, in some cases, provided for each pixel. As described above, a layout area having a certain size is reserved in order to form the capacitance element(s). Thus, when all of capacitance elements that constitute the drive circuits of the pixels are formed on a substrate (a TFT substrate), the layout areas of the individual pixels increase to thereby prevent formation of a higher-definition display device.

Accordingly, it is desirable to provide an organic EL display device that allows for formation of capacitance elements with reduced layout areas of the pixels and an electronic apparatus having the organic EL display device.

One embodiment of the present disclosure provides a configuration that includes organic EL elements provided for respective pixels. Each organic EL element has first and second electrodes between which an organic layer is provided and has a region that contributes to light emission and a region that does not contribute to light emission. A capacitor is formed between the first and second electrodes in the region that does not contribute to light emission and is used as a capacitance element in a drive circuit for the organic EL element.

In the organic EL display device having the above-described configuration, each organic EL element typically has a structure in which an organic layer including a light emitting layer is provided between two electrodes. When a direct-current voltage is applied between the two electrodes in the organic EL element, holes and electrons from the two electrodes are injected into the light emission layer, so that fluorescent molecules in the light emission layer enter excitation states. During the process of relaxation of the excited molecules, light is emitted. A portion from which the light is extracted acts as a light emitting section of the organic EL element. That is, the organic EL element has a region (the light emitting section) that contributes to light emission and a region that does not contribute to light emission.

In the region that contributes to light emission, since two electrodes oppose each other with the organic layer interposed therebetween, a capacitance component exists between the two electrodes. The capacitance component provides an equivalent capacitor of the organic EL element. In the region that does not contribute to light emission, when the two electrodes are made to oppose each other, a capacitor can also be formed therebetween. The size (the capacitance value) of the capacitor in this case is determined according to opposing areas of the two electrodes, the distance between the two electrodes, and a dielectric constant of a dielectric interposed between the two electrodes. When the capacitor formed between the two electrodes in the region that does not contribute to light emission is used as a capacitance element in the drive circuit for the organic EL element, the area for forming the capacitance element can be reduced or eliminated. Thus, the layout areas of the pixels can be reduced.

According to the present disclosure, the use of the capacitor formed between the two electrodes in the region that does not contribute to light emission as the capacitance element in the drive circuit for the organic EL element can reduce the layout area of each pixel. This can achieve a higher definition of the organic EL display device.

DETAILED DESCRIPTION OF EMBODIMENTS

Modes (hereinafter referred to as "embodiments") for carrying out the present disclosure will be described below in detail with reference to the accompanying drawings. A description below is given in the following sequence:

1. Organic EL Display Device to which Embodiment of Present Disclosure is Applied
1-1. System Configuration
1-2. Basic Circuit Operation
1-3. Drawback of Capacitance Elements Included in Pixel
2. Embodiments
2-1. Structure of Typical Organic EL Element
2-2. Structure of Organic EL Element of First Embodiment
2-3. Structure of Organic EL Element of Second Embodiment
2-4. Structure of Organic EL Element of Third Embodiment
2-5. Structure of Organic EL Element of Fourth Embodiment
3. Application Examples
4. Electronic Apparatuses

1. ORGANIC EL DISPLAY DEVICE TO WHICH EMBODIMENT OF PRESENT DISCLOSURE IS APPLIED

[1-1. System Configuration]

Figure 1:
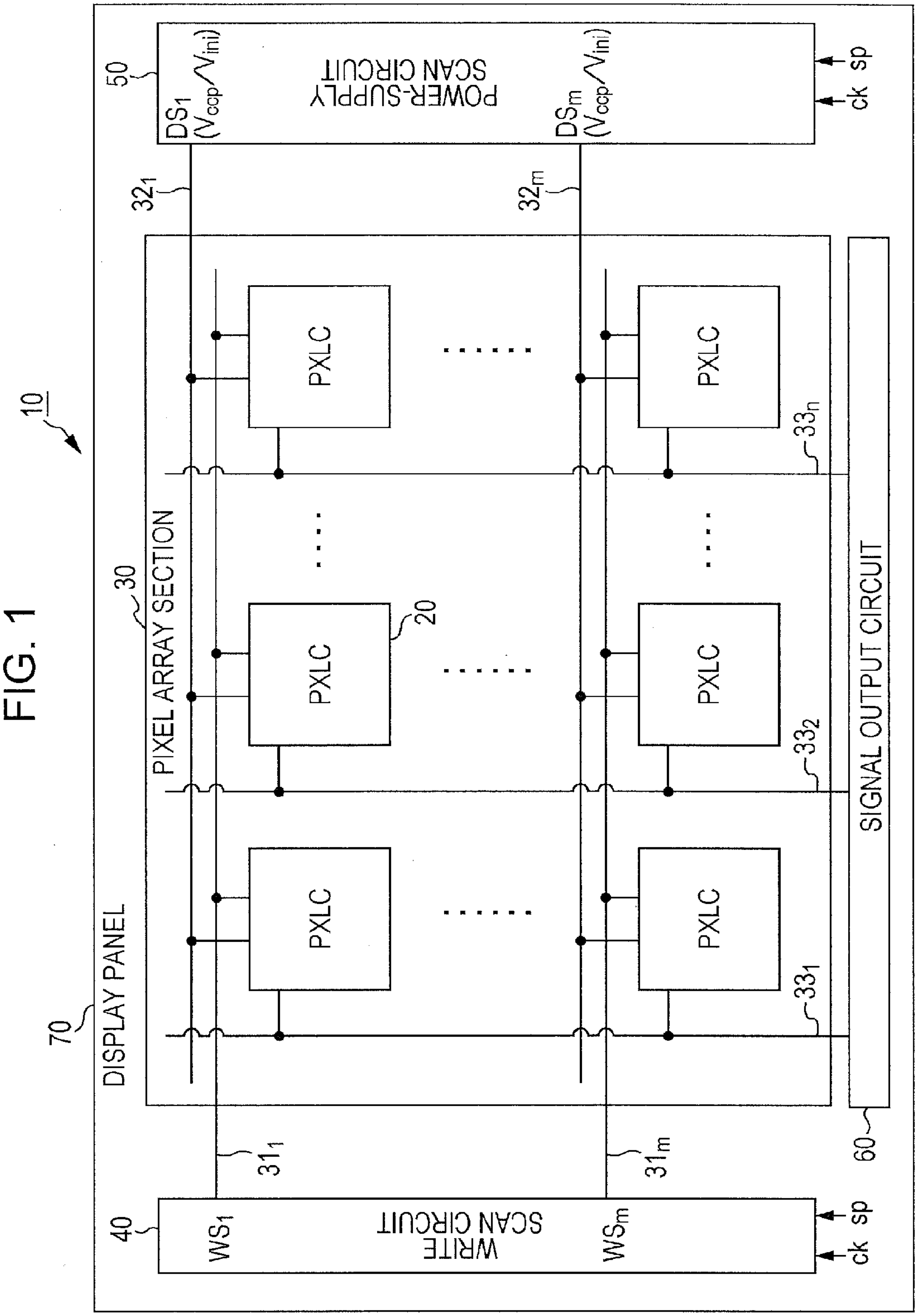
FIG. 1 is a system block diagram showing an overview of the configuration of an active matrix organic EL display device to which an embodiment of the present disclosure is applied.

FIG. 1 is a system block diagram showing an overview of the configuration of an active matrix organic EL display device to which an embodiment of the present disclosure is applied.

In the active matrix organic EL display device, active elements (e.g., insulated-gate field effect transistors) provided in the same pixels as the pixels in which the organic EL elements (which are current-driven electro-optical elements) are provided control current flowing in the organic EL elements. The insulated-gate field effect transistors are typically implemented by TFTs (thin film transistors).

As shown in FIG. 1, an organic EL display device 10 according to the present application example has pixels 20 including organic EL elements, a pixel array section 30 in which the pixels 20 are two-dimensionally arranged in a matrix, and a drive circuit section disposed in the vicinity of the pixel array section 30. The drive circuit section includes a write scan circuit 40, a power-supply scan circuit 50, a signal output circuit 60, and so on to drive the pixels 20 in the pixel array section 30.

When the organic EL display device 10 is a color display device, a single pixel (a unit pixel) that serves as a unit for forming a color image is constituted by multiple sub pixels, which correspond to the pixel 20 shown in FIG. 1. More specifically, in the color display device, one pixel is constituted by three sub pixels, for example, a sub pixel for emitting red (R) light, a sub pixel for emitting green (G) light, and a sub pixel for emitting blue (B) light.

One pixel, however, is not limited to a combination of sub pixels having the three primary colors including RGB. That is, a sub pixel for another color or sub pixels for other colors may be further added to the three-primary-color sub pixels to constitute a single pixel. More specifically, for example, in order to improve the luminance, a sub pixel for emitting white (W) light may be added to constitute a single pixel or, in order to increase the color reproduction range, at least one sub pixel for emitting complementary color may be added to constitute a single pixel.

With respect to the pixels 20 arranged in m rows×n columns in the pixel array section 30, scan lines 31 ($31_1$ to $31_m$) and power-supply lines 32 ($32_1$ to $32_m$) are arranged in corresponding pixel rows along a row direction (i.e., in a direction in which the pixels 20 in the pixel rows are arranged). In addition, with respect the pixels 20 arranged in m rows×n columns, signal lines 33 ($33_1$ to $33_n$) are arranged in corresponding pixel columns along a column direction (i.e., in a direction in which the pixels 20 in the pixel columns are arranged).

The scan lines $31_1$ to $31_m$ are connected to corresponding row output ends of the write scan circuit 40. The power-supply lines $32_1$ to $32_m$ are connected to corresponding row output ends of the power-supply scan circuit 50. The signal lines $33_1$ to $33_n$ are connected to corresponding column output ends of the signal output circuit 60.

In general, the pixel array section 30 is provided on a transparent insulating substrate, such as a glass substrate. Thus, the organic EL display device 10 has a flat panel structure. Drive circuits for the pixels 20 in the pixel array section 30 may be fabricated using amorphous silicon TFTs or low-temperature polysilicon TFTs. When low-temperature polysilicon TFTs are used, the write scan circuit 40, the power-supply scan circuit 50, and the signal output circuit 60 may also be disposed on the display panel (plate) 70 included in the pixel array section 30, as shown in FIG. 1.

The write scan circuit 40 includes shift register circuits or the like that sequentially shift (transfer) a start pulse sp in synchronization with a clock pulse ck. During signal-voltage writing of a video signal to the pixels 20 in the pixel array section 30, the write scan circuit 40 sequentially supplies write scan signals WS ($WS_1$ to $WS_m$) to the corresponding scan lines 31 ($31_1$ to $31_m$) to thereby sequentially scan, for each row, the pixels 20 in the pixel array section 30 (i.e., line sequence scanning).

The power-supply scan circuit 50 includes shift register circuits or the like that sequentially shift a start pulse sp in synchronization with a clock pulse ck. In synchronization with line sequential scanning performed by the write scan circuit 40, the power-supply scan circuit 50 supplies power-supply potentials DS ($DS_1$ to $DS_m$) to the corresponding power-supply lines 32 ($32_1$ to $32_m$). Each power-supply potential DS can be switched between a first power-supply potential $V_{ccp}$ and a second power-supply potential $V_{ini}$, which is lower than the first power-supply potential $V_{ccp}$. Through the switching between the power supply potentials $V_{ccp}$ and $V_{ini}$ of the power-supply potential DS, light emission and light non-emission of the pixels 20 are controlled.

The signal output circuit 60 selectively outputs a signal voltage $V_{sig}$ of a video signal corresponding to luminance information supplied from a signal supply source (not shown) and a reference voltage $V_{ofs}$. The reference voltage $V_{ofs}$ serves as a reference potential for the signal voltage $V_{sig}$ of the video signal (and corresponds to, for example, a voltage for a black level of a video signal) and is used for threshold correction processing (described below).

The signal voltage $V_{sig}$ and the reference potential $V_{ofs}$ selectively output from the signal output circuit 60 are written, for each pixel row selected by the scanning of the write scan circuit 40, to the corresponding pixels 20 in the pixel array section 30 through the signal lines 33 ($33_1$ to $33_n$). That is, the signal output circuit 60 has a line-sequential writing drive system for writing the signal voltage $V_{sig}$ for each row (line).

(Pixel Circuit)

Figure 2:
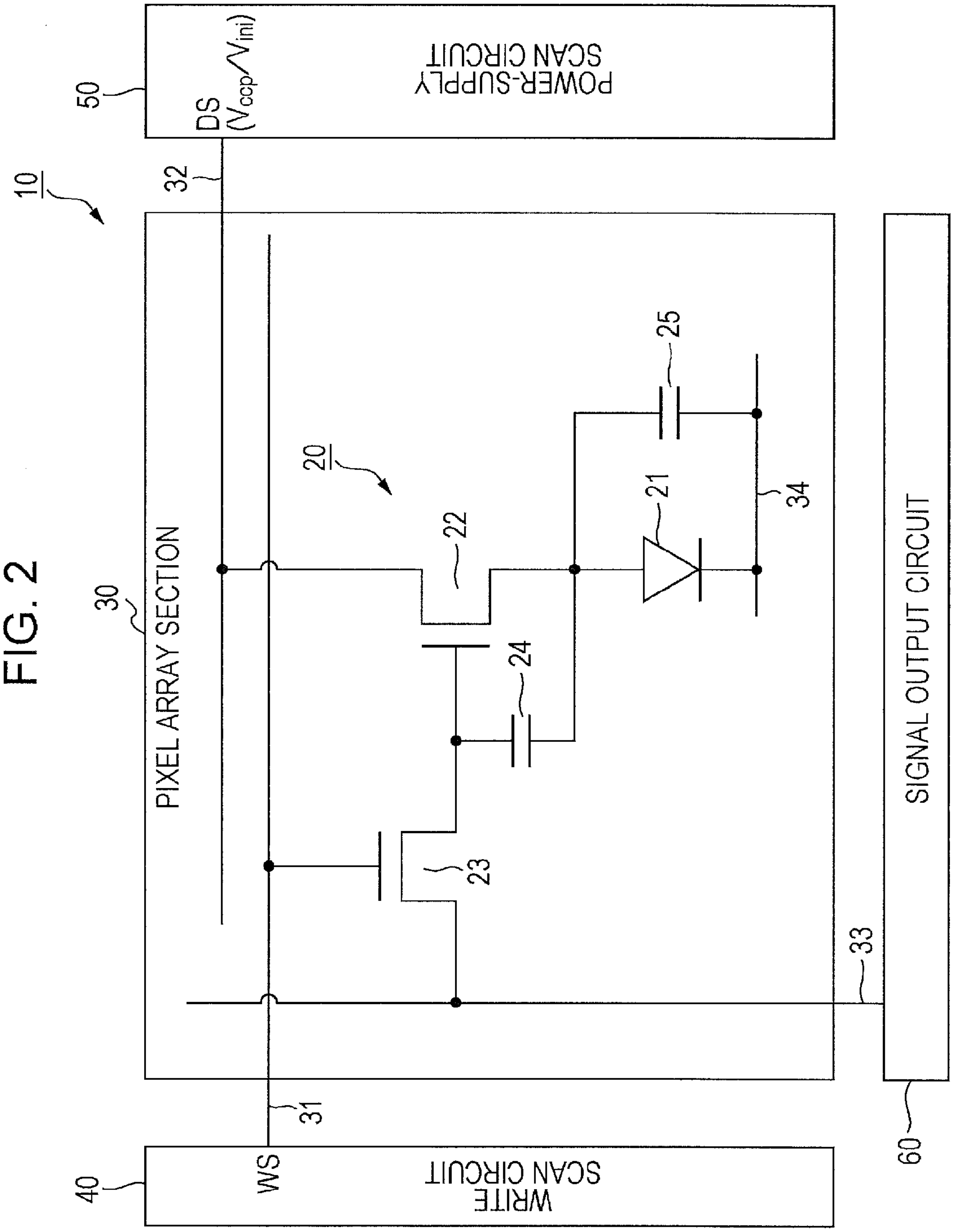
FIG. 2 is a circuit diagram showing one example a specific circuit configuration of one pixel (pixel circuit)

FIG. 2 is a circuit diagram showing one example of a specific circuit configuration of one pixel (pixel circuit) 20. The pixel 20 has a light emitting section including an organic EL element 21, which is a current-driven electro-optical element. The organic EL element 21 has a light-emission luminance that changes in accordance with the value of current flowing through the device.

As shown in FIG. 2, in addition to the organic EL element 21, the pixel 20 includes a drive circuit for driving the organic EL element 21 by flowing current to the organic EL element 21. The organic EL element 21 has a cathode electrode connected to a common power-supply line 34 that is connected to all pixels 20 (this connection may be referred to as "common wiring").

The drive circuit for driving the organic EL element 21 has a drive transistor 22, a write transistor 23, a storage capacitor 24, and an auxiliary capacitor 25. The drive transistor 22 and the write transistor 23 may be implemented by n-channel TFTs. However, the illustrated combination of conductivity types of the drive transistor 22 and the write transistor 23 is merely one example, and the combination of conductivity types is not limed thereto.

A first electrode (a source/drain electrode) of the drive transistor 22 is connected to an anode electrode of the organic EL element 21 and a second electrode (a drain/source electrode) of the drive transistor 22 is connected to a corresponding one of the power-supply lines 32 ($32_1$ to $32_m$).

A first electrode (a source/drain electrode) of the write transistor 23 is connected to a corresponding one of the signal lines 33 ($33_1$ to $33_m$) and a second electrode (a drain/source electrode) of the write transistor 23 is connected to a gate electrode of the drive transistor 22. A gate electrode of the write transistor 23 is connected to a corresponding one of the scan lines 31 ($31_1$ to $31_m$).

The expression "first electrodes" of the drive transistor 22 and the write transistor 23 refer to metal wiring lines electrically connected to the source/drain regions and the expression "second electrodes" refer to metal wiring lines electrically connected to the drain/source regions. Depending upon a potential relationship between the first electrode and the second electrode, the first electrode acts as a source electrode or a drain electrode or the second electrode also acts as a drain electrode or a source electrode.

A first electrode of the storage capacitor 24 is connected to the gate electrode of the drive transistor 22 and a second electrode of the storage capacitor 24 is connected to the first electrode of the drive transistor 22 and the anode electrode of the organic EL element 21.

A first electrode of the auxiliary capacitor 25 is connected to the anode electrode of the organic EL element 21 and a second electrode of the auxiliary capacitor 25 is connected to the common power-supply line 34. The auxiliary capacitor 25 may be provided, as appropriate, in order to compensate for a shortage of the capacitance for the organic EL element 21 and in order to increase the write gain of the video signal with respect to the storage capacitor 24. That is, the auxiliary capacitor 25 is an arbitrary element, and may be eliminated when the equivalent capacitor of the organic EL element 21 is sufficiently large.

In this case, although the second electrode of the auxiliary capacitor 25 is connected to the common power-supply line 34, the second electrode of the auxiliary capacitor 25 may be connected to a node at a fixed potential, instead of the common power-supply line 34. Connection of the second electrode of the auxiliary capacitor 25 to a node at a fixed potential makes it possible to compensate for a shortage of the capacitance for the organic EL element 21 and also makes it possible to achieve an increase in the write gain of the video signal with respect to the storage capacitor 24.

The write transistor 23 in the pixel 20 having the above-described configuration enters a conductive state in response to a high (i.e., active) write scan signal WS supplied from the write scan circuit 40 to the gate electrode of the write transistor 23 through the scan line 31. The write transistor 23 then samples the signal voltage $V_{sig}$ of the video signal (corresponding to the luminance information) or the reference potential $V_{ofs}$ supplied from the signal output circuit 60 through the signal line 33 and writes the sampled signal voltage $V_{sig}$ or the reference voltage $V_{ofs}$ to the pixel 20. The written signal voltage $V_{sig}$ or reference voltage $V_{ofs}$ is applied to the gate electrode of the drive transistor 22 and is also stored by the storage capacitor 24.

When the power-supply potential DS of the corresponding one of the power-supply lines 32 ($\mathbf{32}_1$ to $\mathbf{32}_m$) is the first power-supply potential $V_{ccp}$, the drive transistor 22 operates in a saturation region with its first electrode acting as a drain electrode and its second electrode acting as a source electrode. Thus, in response to the current supplied from the power-supply line 32, the drive transistor 22 drives the light emission of the organic EL element 21 by supplying drive current thereto. More specifically, by operating in the saturation region, the drive transistor 22 supplies, to the organic EL element 21, drive current having a current value corresponding to the voltage value of the signal voltage $V_{sig}$ stored by the storage capacitor 24. The drive current causes the organic EL element 21 to be driven to emit light.

When the power-supply potential DS is switched from the first power-supply potential $V_{ccp}$ to the second power-supply potential $V_{ini}$, the drive transistor 22 operates as a switching transistor with its first electrode acting as a source electrode and its second electrode acting as a drain electrode. Through the switching operation, the drive transistor 22 stops the supply of the drive current to the organic EL element 21 to put the organic EL element 21 into a light non-emission state. That is, the drive transistor 22 also has the function of a transistor for controlling the light emission and non-emission of the organic EL element 21.

The drive transistor 22 performs a switching operation to provide a period (a light non-emission period) in which the organic EL element 21 does not emit light, thus making it possible to control the (duty) ratio of the light emission period and the light non-emission period of the organic EL element 21. Through the duty control, afterimage involved in the light emission of the pixel 20 throughout one display frame period can be reduced. Thus, in particular, the image quality of a moving image can be further improved.

Of the first and second power-supply voltages $V_{ccp}$ and $V_{ini}$ selectively supplied from the power-supply scan circuit 50 through the power-supply line 32, the first power-supply potential $V_{ccp}$ is a power-supply potential for supplying, to the drive transistor 22, drive current for driving the light emission of the organic EL element 21. The second power-supply potential $V_{ini}$ is a power-supply potential for reversely biasing the organic EL element 21. The second power-supply potential $V_{ini}$ is set lower than the reference voltage $V_{ofs}$. For example, the second power-supply potential $V_{ini}$ is set to a potential that is lower than $V_{ofs}-V_{th}$, preferably, to a potential that is sufficiently lower than $V_{ofs}-V_{th}$, where $V_{th}$ indicates a threshold voltage of the drive transistor 22.

[1-2. Basic Circuit Operation]

Next, a basic circuit operation of the organic EL display device 10 having the above-described configuration will be described with reference to a timing waveform diagram shown in FIG. 3 and operation diagrams shown in FIGS. 4A to 5D. In the operation diagrams shown in FIGS. 4A to 5D, the write transistor 23 is represented by a switch symbol, for simplicity of illustration. An equivalent capacitor 25 of the organic EL element 21 is also shown.

Figure 3:
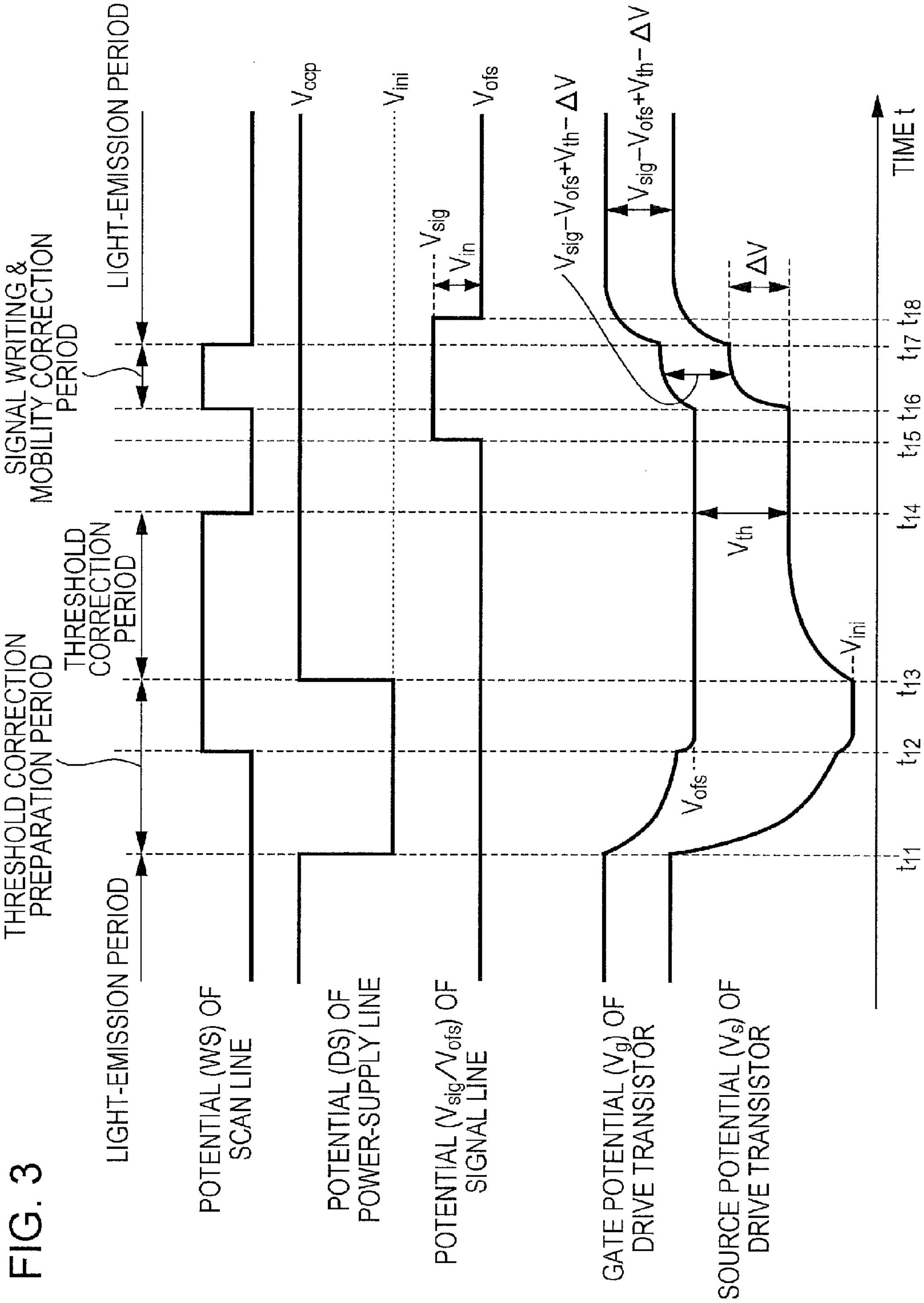
FIG. 3 is a timing waveform diagram illustrating a basic circuit operation of the organic EL display device to which an embodiment of the present disclosure is applied.

The timing waveform diagram of FIG. 3 shows a change in the potential (write scan signal) WS of the scan line 31, a change in the potential (power-supply potential) DS of the power-supply line 32, a change in the potential ($V_{sig}/V_{ofs}$) of the signal line 33, and changes in a gate potential $V_g$ and a source potential $V_s$ of the drive transistor 22.

(Light Emission Period of Previous Display Frame)

In the timing waveform diagram of FIG. 3, a period before time $t_{11}$ is a light emission period of the organic EL element 21 for a previous display frame. In the light emission period for the previous display frame, the potential DS of the power-supply line 32 is at the first power-supply potential (hereinafter referred to as a "high potential") $V_{ccp}$ and the write transistor 23 is in the non-conductive state.

Figure 4A:
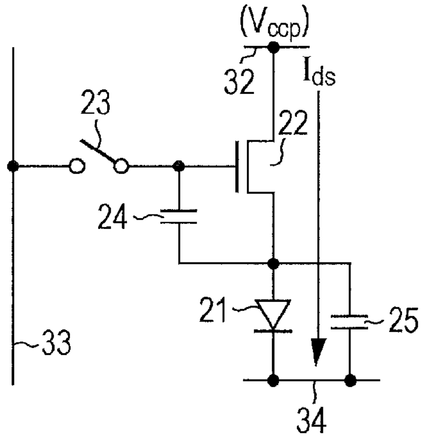
FIGS. 4A to 4D are diagrams (part 1) illustrating the basic circuit operation of the organic EL display device to which an embodiment of the present disclosure is applied.

The drive transistor 22 is designed so that, at this point, it operates in its saturation region. Thus, as shown in FIG. 4A, a drive current (a drain-source current) $I_{ds}$ corresponding to a gate-source voltage $V_{gs}$ of the drive transistor 22 is supplied from the power-supply line 32 to the organic EL element 21 through the drive transistor 22. Consequently, the organic EL element 21 emits light with a luminance corresponding to the current value of the drive current $I_{ds}$.

(Threshold Correction Preparation Period)

Figure 4B:
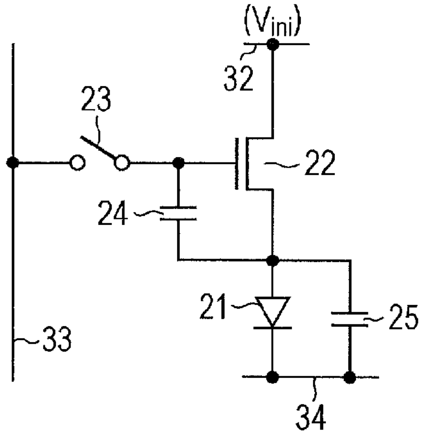

At time $t_{11}$, the operation enters a new display frame (a present display frame) for line-sequential scanning. As shown in FIG. 4B, the potential DS of the power-supply line 32 is switched from the high potential $V_{ccp}$ to the second power-supply potential (hereinafter referred to as a "low potential") $V_{ini}$, which is sufficiently lower than $V_{ofs}-V_{th}$ relative to the reference potential $V_{ofs}$ of the signal line 33.

Let $V_{thel}$ be a threshold voltage of the organic EL element 21 and let $V_{cath}$ be the potential (cathode potential) of the common power-supply line 34. In this case, when the low potential $V_{ini}$ is assumed to satisfy $V_{ini}<V_{thel}+V_{cath}$, the source potential $V_s$ of the drive transistor 22 is substantially equal to the low potential $V_{ini}$. As a result, the organic EL element 21 is put into a reverse-biased state and turns off the light emission.

Figure 4C:
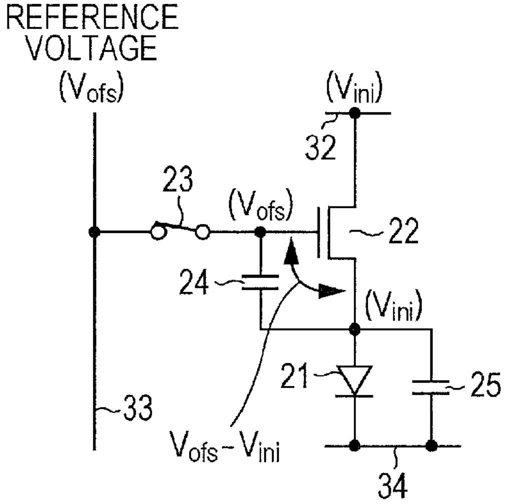

Next, at time $t_{12}$, the potential WS of the scan line 31 shifts from a low-potential side toward a high-potential side, so that the write transistor 23 is put into a conductive state, as shown in FIG. 4C. At this point, since the reference potential $V_{ofs}$ is supplied from the signal output circuit 60 to the signal line 33, the gate potential $V_g$ of the drive transistor 22 acts as the reference potential $V_{ofs}$. The source potential $V_s$ of the drive transistor 22 is equal to the potential $V_{ini}$ that is sufficiently lower than the reference potential $V_{ofs}$, i.e., is equal to the low potential $V_{ini}$.

At this point, the gate-source voltage $V_{gs}$ of the drive transistor 22 is equal to $V_{ofs}-V_{ini}$. In this case, unless $V_{ofs}-V_{ini}$ is sufficiently larger than the threshold voltage $V_{th}$ of the drive transistor 22, it is difficult to perform threshold correction processing described below. Thus, setting is performed so as to satisfy a potential relationship expressed by $V_{ofs}-V_{ini}>V_{th}$.

Processing for initialization by fixing (setting) the gate potential $V_g$ of the drive transistor 22 to the reference potential $V_{ofs}$ and fixing the source potential $V_s$ to the low potential $V_{ini}$ is processing for preparation (threshold correction preparation) before the threshold correction processing (threshold correction operation) described below is performed. Thus, the reference potential $V_{ofs}$ and the low potential $V_{ini}$ serve as initialization potentials for the gate potential $V_g$ and the source potential $V_s$ of the drive transistor 22.

(Threshold Correction Period)

Figure 4D:
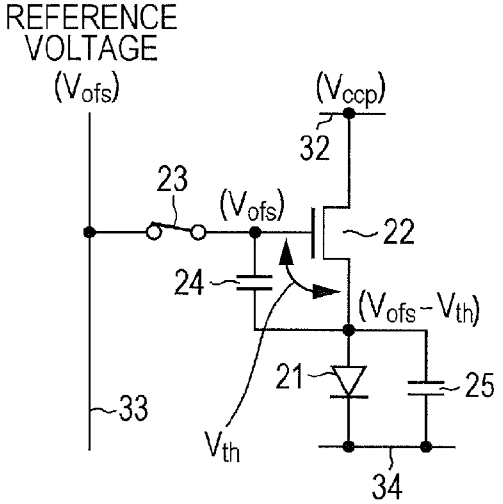

Next, at time $t_{13}$, the potential DS of the power-supply line 32 is switched from the low potential $V_{ini}$ to the high potential $V_{ccp}$, as shown in FIG. 4D, and the threshold correction processing is started while the gate potential $V_g$ of the drive transistor 22 is maintained at the reference voltage $V_{ofs}$. That is, the source potential $V_s$ of the drive transistor 22 starts to increase toward a potential obtained by subtracting the threshold voltage $V_{th}$ of the drive transistor 22 from the gate potential $V_g$.

Herein, the processing for changing the source potential $V_s$ toward the potential obtained by subtracting the threshold voltage $V_{th}$ of the drive transistor 22 from the initialization potential $V_{ofs}$, with reference to the initialization potential $V_{ofs}$ of the gate potential $V_g$ of the drive transistor 22, is referred to as "threshold correction processing", for convenience of description. When the threshold correction processing progresses, the gate-source voltage $V_{gs}$ of the drive transistor 22 eventually settles to the threshold voltage $V_{th}$ of the drive transistor 22. A voltage corresponding to the threshold voltage $V_{th}$ is stored by the storage capacitor 24.

In the period in which the threshold correction processing is performed (i.e., in a threshold correction period), the potential $V_{cath}$ of the common power-supply line 34 is set so that the organic EL element 21 is put into a cutoff state, in order to cause current to flow to the storage capacitor 24 and to prevent current from flowing to the organic EL element 21.

Figure 5A:
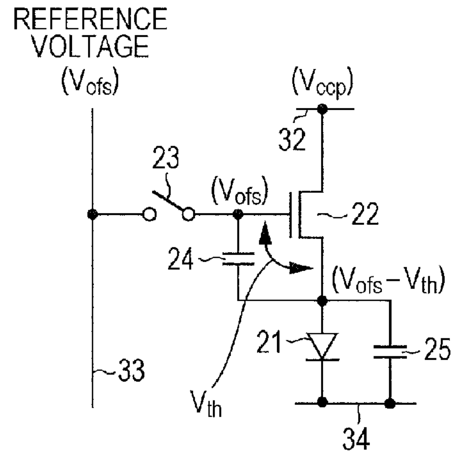
FIGS. 5A to 5D are diagrams (part 2) illustrating the basic circuit operation of the organic EL display device to which an embodiment of the present disclosure is applied.

Next, at time $t_{14}$, the potential WS of the scan line 31 shifts toward the low-potential side, so that the write transistor 23 is put into a non-conductive state, as shown in FIG. 5A. At this point, the gate electrode of the drive transistor 22 is electrically disconnected from the signal line 33, so that the gate electrode of the drive transistor 22 enters a floating state. However, since the gate-source voltage $V_{gs}$ is equal to the threshold voltage $V_{th}$ of the drive transistor 22, the drive transistor 22 is in a cutoff state. Thus, almost no drain-source current $I_{ds}$ flows to the drive transistor 22.

(Signal Writing & Mobility Correction Period)

Figure 5B:
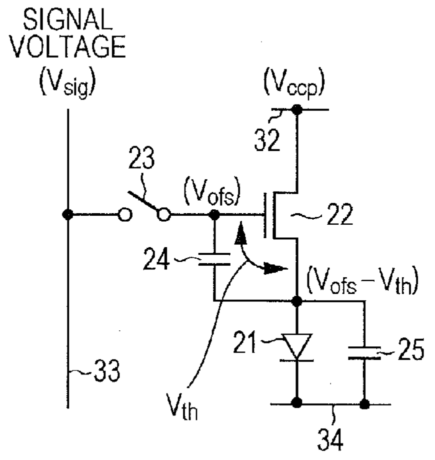
Figure 5C:
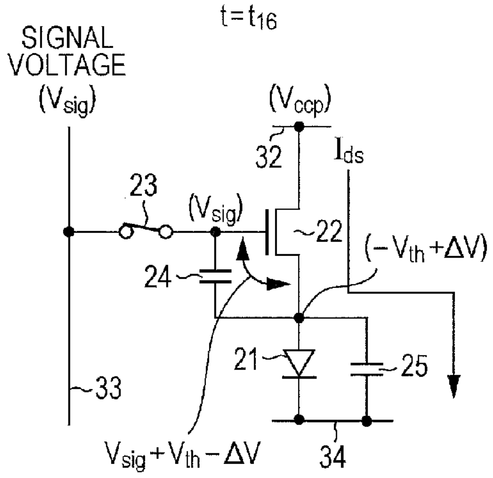

Next, at time $t_{15}$, as shown in FIG. 5B, the potential of the signal line 33 is switched from the reference potential $V_{ofs}$ to the signal voltage $V_{sig}$ of the video signal. Subsequently, at time $t_{16}$, the potential WS of the scan line 31 shifts toward the high-potential side, so that the write transistor 23 enters a conductive state, as shown in FIG. 5C, to sample the signal voltage $V_{sig}$ of the video signal and to write the signal voltage $V_{sig}$ to the pixel 20.

When the write transistor 23 writes the signal voltage $V_{sig}$, the gate potential $V_g$ of the drive transistor 22 becomes equal to the signal voltage $V_{sig}$. When the drive transistor 22 is driven with the signal voltage $V_{sig}$ of the video signal, the threshold voltage $V_{th}$ of the drive transistor 22 is cancelled out by a voltage corresponding to the threshold voltage $V_{th}$ stored by the storage capacitor 24. Details of the principle of the threshold cancellation are described below.

At this point, the organic EL element 21 is in the cutoff state (a high impedance state). Thus, the current (the drain-source current $I_{ds}$) flowing from the power-supply line 32 to the drive transistor 22 in accordance with the signal voltage $V_{sig}$ of the video signal flows to the equivalent capacitor of the organic EL element 21 and the auxiliary capacitor 25. As a result, charging of the equivalent capacitor of the organic EL element 21 and the auxiliary capacitor 25 is started.

As a result of the charging of the equivalent capacitor of the organic EL element 21 and the auxiliary capacitor 25, the source potential $V_s$ of the drive transistor 22 increases with a lapse of time. Since variations in the threshold voltages $V_{th}$ of the drive transistors 22 of the pixels have already been cancelled out at this point, the drain-source current $I_{ds}$ of the drive transistor 22 depends on the mobility μ of the drive transistor 22. The mobility μ of the drive transistor 22 refers to mobility of a semiconductor thin film included in a channel of the drive transistor 22.

It is now assumed that the ratio of the voltage $V_{gs}$ stored by the storage capacitor 24 to the signal voltage $V_{sig}$ of the video signal (the ratio is referred to as a "write gain G") is 1 (an ideal value). In this case, the source potential $V_s$ of the drive transistor 22 increases to a potential expressed by $V_{ofs}-V_{th}+\Delta V_s$ so that the gate-source voltage $V_{gs}$ of the drive transistor 22 reaches a value expressed by $V_{sig}-V_{ofs}+V_{th}-\Delta V$.

That is, an increase ΔV in the source potential $V_s$ of the drive transistor 22 acts so that it is subtracted from the voltage ($V_{sig}-V_{ofs}+V_{th}$) stored by the storage capacitor 24, i.e., so that the electrical charge in the storage capacitor 24 is discharged. In other words, negative feedback corresponding to the increase ΔV in the source potential $V_s$ is applied to the storage capacitor 24. Thus, the increase ΔV in the source potential $V_s$ corresponds to the amount of negative feedback.

When negative feedback having the amount ΔV of feedback corresponding to the drain-source current $I_{ds}$ flowing to the drive transistor 22 is applied to the gate-source voltage $V_{gs}$ in the manner described above, it is possible to cancel the dependence of the drain-source current $I_{ds}$ of the drive transistor 22 upon the mobility μ. This processing for cancelling the dependence on the mobility μ is mobility correction processing for correcting variations in the mobilities μ of the drive transistors 22 of the individual pixels.

More specifically, the higher the signal amplitude $V_{in}$ ($=V_{sig}-V_{ofs}$) of the video signal written to the gate electrode of the drive transistor 22, the larger the drain-source current $I_{ds}$ is. Thus, the absolute value of the amount ΔV of negative feedback also increases. Accordingly, the mobility correction processing is performed in accordance with the light-emission luminance level.

When the signal amplitude $V_{in}$ of the video signal is constant, the absolute value of the amount ΔV of negative feedback increases as the mobility μ of the drive transistor 22 increases. Thus, variations in the mobilities μ of individual pixels can be reduced or eliminated. That is, the amount ΔV of negative feedback can also be referred to as the "amount of correction of the mobility correction processing". Details of the principle of the mobility correction are described below.

(Light Emission Period)

Figure 5D:
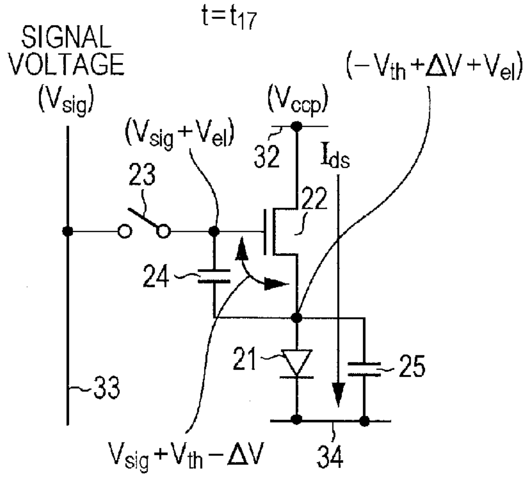

Next, at time $t_{17}$, the potential WS of the scan line 31 shifts toward the low-potential side, so that the write transistor 23 is put into a non-conductive state, as shown in FIG. 5D. Consequently, the gate electrode of the drive transistor 22 is electrically disconnected from the signal line 33, so that the gate electrode of the drive transistor 22 enters a floating state.

In this case, when the gate electrode of the drive transistor 22 is in the floating state, the gate potential $V_g$ also varies in conjunction with variations in the source potential $V_s$ of the drive transistor 22, since the storage capacitor 24 is connected between the gate and the source of the drive transistor 22. Such an operation in which the gate potential $V_g$ of the drive transistor 22 varies in conjunction with variations in the source potential $V_s$ is herein referred to as a "bootstrap operation" performed by the storage capacitor 24.

At the same time the gate electrode of the drive transistor 22 enters the floating state, the drain-source current $I_{ds}$ of the drive transistor 22 starts to flow to the organic EL element 21, so that the anode potential of the organic EL element 21 increases in response to the drain-source current $I_{ds}$.

When the anode potential of the organic EL element 21 exceeds $V_{thel}+V_{cath}$, the drive current starts to flow to the organic EL element 21 to thereby cause the organic EL element 21 to start light emission. The increase in the anode potential of the organic EL element 21 is due to an increase in the source potential $V_s$ of the drive transistor 22. When the source potential $V_s$ of the drive transistor 22 increases, the bootstrap operation of the storage capacitor 24 causes the gate potential $V_g$ of the drive transistor 22 to increase in conjunction with the source potential $V_s$.

When the gain of the bootstrap is assumed to be 1 (an ideal value), the amount of increase in the gate potential $V_g$ is equal to the amount of increase in the source potential $V_s$. Therefore, in the light-emission period, the gate-source voltage $V_{gs}$ of the drive transistor 22 is maintained constant at $V_{sig}-V_{ofs}+V_{th}-\Delta V$. At time $t_{18}$, the potential of the signal line 33 is switched from the signal voltage $V_{sig}$ of the video signal to the reference voltage $V_{ofs}$.

In the above-described series of circuit operations, the processing operations of the threshold correction preparation, the threshold correction, the writing (signal writing) of the signal voltage $V_{sig}$, and the mobility correction are executed in one horizontal scan period (1H). The processing operations of the signal writing and the mobility correction are executed in parallel in the period of time $t_{16}$ to time $t_{17}$.

(Division Threshold Correction)

Although the above description has been given of an example using a drive method for executing the threshold correction processing only once, the drive method is merely one example and is not limited thereto. For example, a drive method for performing so-called "division threshold correction" may also be employed. In the division threshold correction, in addition to the 1H period in which the threshold correction processing is performed in conjunction with the mobility correction and the signal write processing, the threshold correction processing is performed multiple times, i.e., in multiple horizontal scan periods in a divided manner, prior to the 1H period.

With the drive method for the division threshold correction, even when a time allocated to one horizontal scan period is reduced as a result of an increased number of pixels for a higher definition, a sufficient amount of time can be ensured in the multiple scan periods for the threshold correction periods. Thus, since a sufficient amount of time can be ensured as a threshold correction period even when the time allocated to one horizontal scan period is reduced, it is possible to reliably execute the threshold correction processing.

[Principle of Threshold Cancellation]

The principle of the threshold cancellation (i.e., threshold correction) of the drive transistor 22 will now be described. Since the drive transistor 22 is designed so as to operate in the saturation region, it operates as a constant current source. As a result, a certain amount of drain-source current (drive current) $I_{ds}$ flows from the drive transistor 22 to the organic EL element 21, and is given by:

$$I_{ds}=(1/2)\cdot\mu(W/L)C_{ox}(V_{gs}-V_{th})^2 \quad (1)$$

where W indicates a channel width of the drive transistor 22, L indicates a channel length, and $C_{ox}$ indicates a gate capacitance per unit area.

Figure 6A:
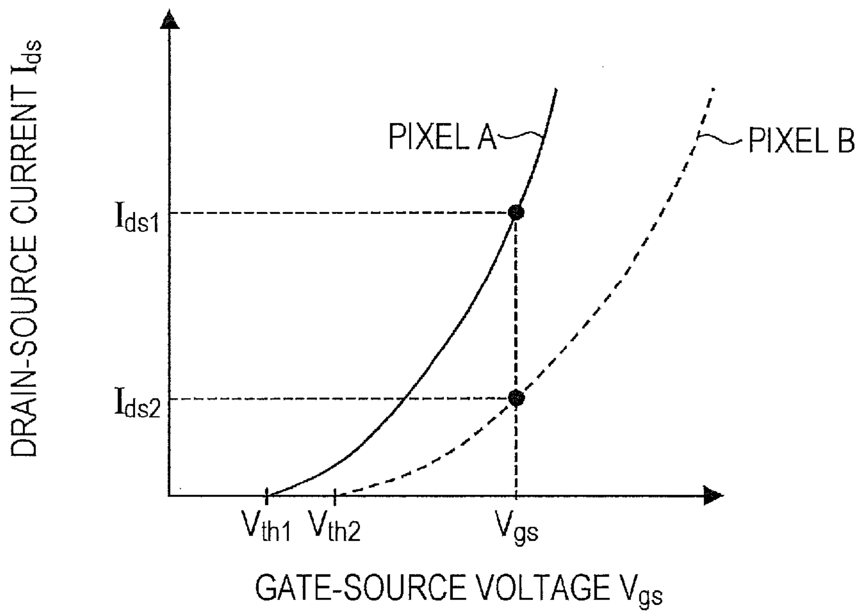
FIG. 6A is a graph illustrating a problem due to variation in a threshold voltage of a drive transistor and FIG. 6B is a graph illustrating a problem due to variations in mobility of the drive transistor.

FIG. 6A is a graph showing a characteristic of the drain-source current $I_{ds}$ of the drive transistor 22 versus the gate-source voltage $V_{gs}$. As shown in the graph in FIG. 6A, if no cancellation processing (correction processing) is performed on variations in the threshold voltage $V_{th}$ of the drive transistor 22 in each individual pixel, the drain-source current $I_{ds}$ corresponding to the gate-source voltage $V_{gs}$ becomes $I_{ds}$ when the threshold voltage $V_{th}$ is $V_{th1}$.

In contrast, when the threshold voltage $V_{th}$ is $V_{th2}$ ($V_{th2}>V_{th1}$), the drain-source current $I_{ds}$ corresponding to the same gate-source voltage $V_{gs}$ becomes $I_{ds2}$ ($I_{ds2}<I_{ds1}$). That is, when the threshold voltage $V_{th}$ of the drive transistor 22 varies, the drain-source current $I_{ds}$ varies even when the gate-source voltage $V_{gs}$ is constant.

On the other hand, in the pixel (pixel circuit) 20 having the above-described configuration, the gate-source voltage $V_{gs}$ of the drive transistor 22 during light emission is expressed by $V_{sig}-V_{ofs}+V_{th}-\Delta V_s$ as described above. Thus, substituting this expression into equation (1) noted above yields a drain-source current $I_{ds}$ given by:

$$I_{ds}=(1/2)\cdot\mu(W/L)C_{ox}(V_{sig}-V_{ofs}-\Delta V)^2 \quad (2)$$

That is, the term of the threshold voltage $V_{th}$ of the drive transistor 22 is cancelled, so that the drain-source current $I_{ds}$ supplied from the drive transistor 22 to the organic EL element 21 does not depend on the threshold voltage $V_{th}$ of the drive transistor 22. As a result, even when the threshold voltage $V_{th}$ of the drive transistor 22 is varied for each pixel by variations in the manufacturing process of the drive transistor 22, aging, or the like, the drain-source current $I_{ds}$ does not vary. Accordingly, the light-emission luminance of the organic EL element 21 can be maintained constant.

[Principle of Mobility Correction]

Figure 6B:
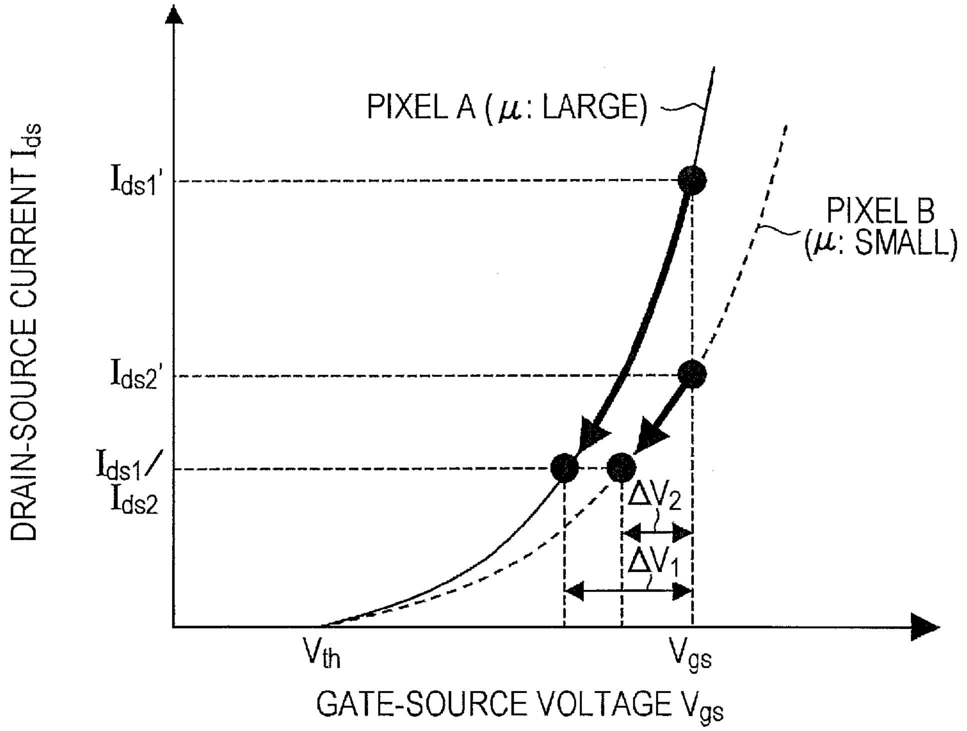

The principle of the mobility correction of the drive transistor 22 will be described next. FIG. 6B is a graph showing characteristic curves for comparison between a pixel A in which the mobility μ of the drive transistor 22 is relatively large and a pixel B in which the mobility μ of the drive transistor 22 is relatively small. When the drive transistor 22 is implemented by a polysilicon TFT or the like, variations in the mobilities μ of the pixels occur, such as those in pixels A and B.

A description will now be given of an example in which the signal amplitudes $V_{in}(=V_{sig}-V_{ofs})$ at the same level are written to the gate electrodes of the drive transistors 22 of pixels A and B when mobilities μ in pixels A and B have variations. In this case, if no correction is performed on the mobilities μ, a large difference occurs between a drain-source current $I_{ds1}'$ flowing through pixel A having a large mobility μ and a drain-source current $I_{ds2}'$ flowing through pixel B having a small mobility μ. When a large difference occurs between the drain-source currents $I_{ds}$ in the pixels as a result of variations in the mobilities μ of the pixels, uniformity on the screen is impaired.

As is apparent from the transistor characteristic given by equation (1) noted above, the drain-source current $I_{ds}$ increases as the mobility μ increases. Thus, the amount ΔV of negative feedback increases as the mobility μ, increases. As shown in FIG. 6B, the amount $\Delta V_1$ of negative feedback in pixel A having a large mobility μ is larger than the amount $\Delta V_2$ of negative feedback in pixel B having a small mobility μ.

Accordingly, when the mobility correction processing is performed so that negative feedback having the amount ΔV of feedback corresponding to the drain-source current $I_{ds}$ of the drive transistor 22 is applied to the gate-source voltage $V_{gs}$, a larger amount of negative feedback is applied as the mobility μ increases. As a result, it is possible to suppress variations in the mobilities μ of the pixels.

More specifically, when correction corresponding to the amount $\Delta V_1$ of negative feedback is performed on pixel A having a large mobility μ, the drain-source current $I_{ds}$ decreases significantly from $I_{ds1}'$ to $I_{ds1}$. On the other hand, since the amount $\Delta V_2$ of feedback in pixel B having a small mobility μ is small, the drain-source current $I_{ds}$ decreases from $I_{ds2}'$ to $I_{ds2}$ and the amount of this decrease is not so large. As a result, the drain-source current $I_{ds1}$ in pixel A and the drain-source current $I_{ds2}$ in pixel B become substantially equal to each other, so that variations in the mobilities μ of the pixels are corrected.

In short, when pixels A and B having different mobilities μ exist, the amount $\Delta V_1$ of feedback in pixel A having a large mobility μ is larger than the amount $\Delta V_2$ of feedback in pixel B having a small mobility That is, the larger the mobility μ of the pixel, the larger the amount of feedback ΔV is and also the larger the amount of decrease in the drain-source current $I_{ds}$ is.

Thus, as a result of applying the negative feedback having the amount ΔV of feedback corresponding to the drain-source current $I_{ds}$ of the drive transistor 22 to the gate-source voltage $V_{gs}$, the current values of the drain-source currents $I_{ds}$ of the pixels having different mobilities μ become equal to each other. As a result, it is possible to correct variations in the mobilities μ of the pixels. That is, the mobility correction processing is processing in which the negative feedback having the amount ΔV of feedback (the amount of correction) corresponding to the current (drain-source current $I_{ds}$) flowing to the drive transistor 22 is applied to the gate-source voltage $V_{gs}$ of the drive transistor 22, i.e., to the storage capacitor 24.

[1-3. Drawback of Capacitance Elements Included in Pixel]

In the above-described organic EL display device 10 to which an embodiment of the present disclosure is applied, the drive circuit (pixel circuit) of the organic EL element 21 includes the drive transistor 22, the write transistor 23, the storage capacitor 24, and the auxiliary capacitor 25. That is, the drive circuit has, for each pixel, two capacitance elements, i.e., the storage capacitor 24 and the auxiliary capacitor 25.

As described above, a layout area having a certain size is reserved in order to form the capacitance elements. Thus, when all of the capacitance elements included in the drive circuits of the pixels, specifically, the storage capacitors 24 and the auxiliary capacitors 25 in the present application example, are formed on a TFT substrate, the layout areas of the individual pixels are increased, thus making it difficult to achieve a higher density of the display device.

2. EMBODIMENTS

Typically, the organic EL element 21 has a structure in which an organic layer including a light-emitting layer is provided between two electrodes, i.e., an anode electrode and a cathode electrode (details of the structure is described below). In the organic EL element 21, when a direct-current voltage is applied between the two electrodes, holes from the anode electrode and electrons from the cathode electrode are injected into the light emission layer, so that fluorescent molecules in the light emission layer enter excitation states. In the process of relaxation of the excited molecules, light is emitted. A portion from which the light is extracted acts as a light emitting section of the organic EL element 21. That is, the organic EL element 21 has a region (the light emitting section) that contributes to light emission and a region that does not contribute to light emission.

In the region that contributes to light emission, the two electrodes oppose each other with the organic layer interposed therebetween. Thus, a capacitance component that uses the organic layer as a dielectric is formed between the two electrodes. The capacitance component provides an equivalent capacitor of the organic EL element 21. In the region that does not contribute to light emission, when the two electrodes are made to oppose each other, a capacitor can also be formed therebetween. The size (the capacitance value) of the capacitor in this case is determined according to opposing areas of the two electrodes, the distance between the two electrodes, and a dielectric constant of a dielectric interposed between the two electrodes.

The capacitor formed between the two electrodes in the region that does not contribute to light emission is used as the capacitance element in the drive circuit for the organic EL element 21, so that the area corresponding to the layout area in which the capacitance element is formed can be reduced or eliminated. In other words, it is possible to form the capacitance element with a reduced layout area of each pixel 20.

The use of the capacitor formed between the two electrodes in the region that does not contribute to light emission as the capacitance element in the drive circuit for the organic EL element 21 can reduce the layout area of each pixel 20. This can achieve a higher definition of the organic EL display device 10. A description below is given of a specific embodiment in which a capacitor is formed between two electrodes in a region that does not contribute to light emission.

[2-1. Structure of Typical Organic EL Element]

Figure 7:
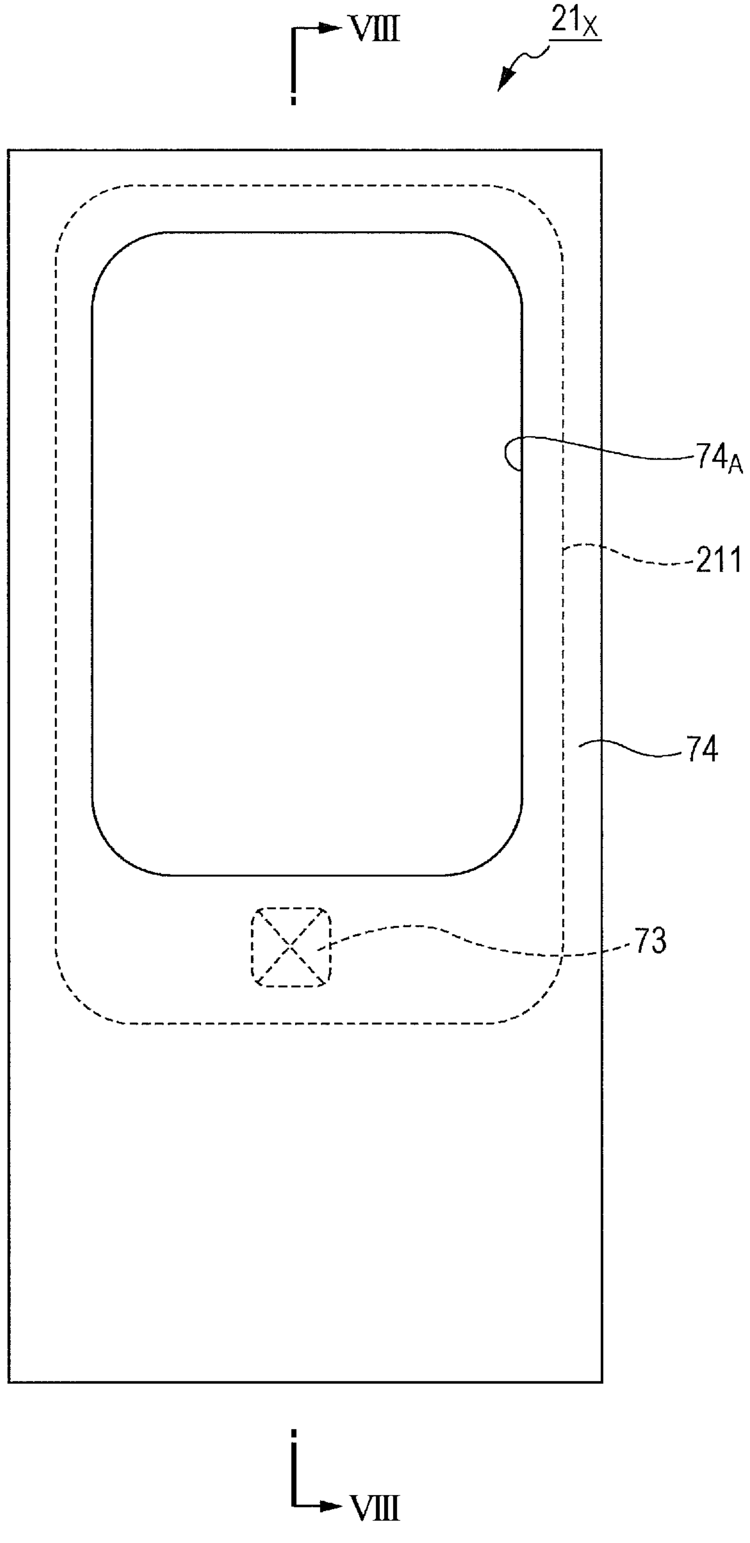
FIG. 7 is a schematic plan view illustrating the structure of a typical organic EL element.
Figure 8:
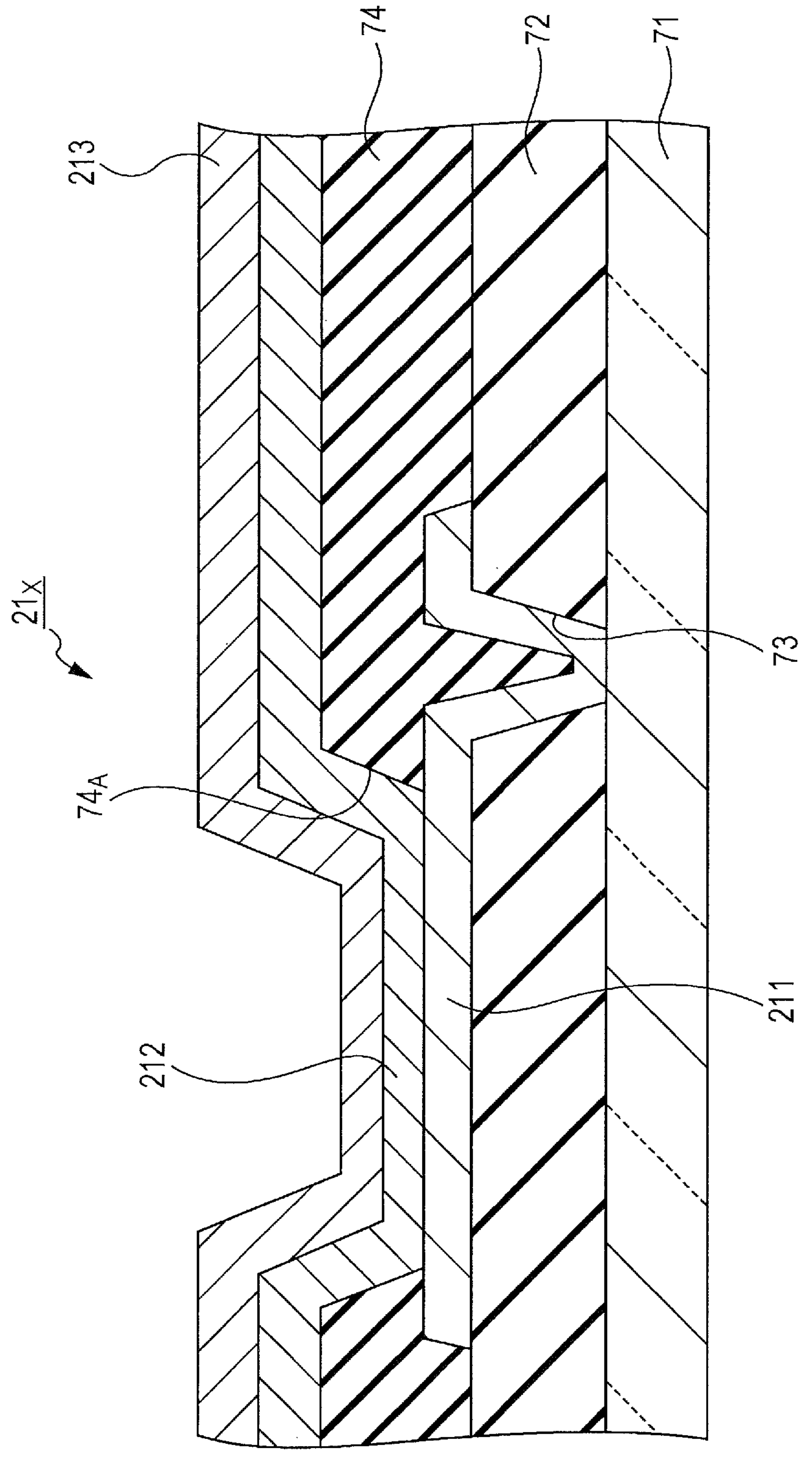
FIG. 8 is a sectional view taken along line VIII-VIII in FIG. 7.

First, the structure of a typical organic EL element $\mathbf{21}_x$ will now be described with reference to FIGS. 7 and 8. FIG. 7 is a schematic plan view showing the structure of the typical organic EL element $\mathbf{21}_x$, except for the cathode electrode and the organic layer. FIG. 8 is a sectional view taken along line VIII-VIII in FIG. 7.

In FIG. 8, a drive circuit (not shown) of the organic EL element $\mathbf{21}_x$ is formed on a transparent insulating substrate, for example, a glass substrate 71. Such a glass substrate 71 on which a drive circuit including a TFT is formed is generally referred to as a "TFT substrate". An insulating planarization film 72 is provided on the TFT substrate 71 to planarize the TFT substrate 71.

An anode electrode 211 of the organic EL element $\mathbf{21}_x$ is provided for each pixel on the insulating planarization film 72. The anode electrode 211 is electrically connected to the drive circuit on the TFT substrate 71, specifically, the source electrode of the drive transistor 22 shown in FIG. 2, through a contact hole 73 formed in the insulating planarization film 72.

A window insulating film 74 is stacked on the insulating planarization film 72. The window insulating film 74 has therein a depression portion $\mathbf{74}_A$, in which the organic EL element $\mathbf{21}_x$ is provided. The organic EL element $\mathbf{21}_x$ is constituted by the anode electrode 211 placed at the bottom portion of the depression portion $\mathbf{74}_A$ of the window insulating film 74, an organic layer 212 formed on the anode electrode 211, and a cathode electrode 213 (which is common to all pixels) formed on the organic layer 212.

Typically, the organic layer 212 is formed by sequentially depositing a hole transport layer/hole injection layer, a light emitting layer, an electron transport layer, and an electron injection layer (not shown) on the anode electrode 211. Through the current driving performed by the drive transistor 22 shown in FIG. 2, current flows from the drive transistor 22 to the organic layer 212 through the anode electrode 211, so that electrons and holes are re-coupled together in the light-emitting layer in the organic layer 212 to thereby emit light.

In the organic EL element $\mathbf{21}_x$, the region where the organic layer 212 is directly sandwiched between the anode electrode 211 and the cathode electrode 213 is a region that contributes to light emission, i.e., a light emitting section. The anode electrode 211 is formed in the region of the light-emitting portion and the region including the contact hole 73 and is not formed in the region that does not contribute to light emission.

[2-2. Structure of Organic EL Element of First Embodiment]

Figure 9:
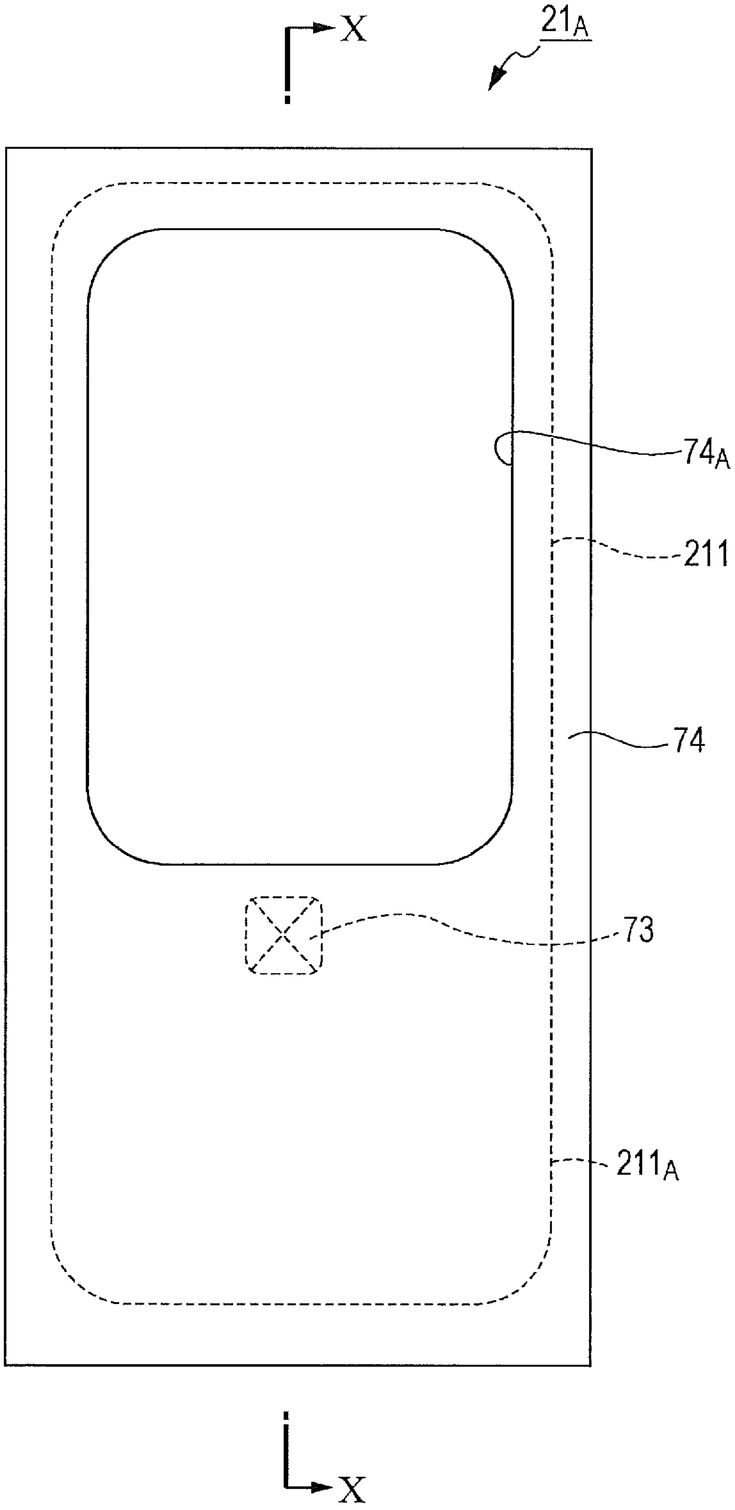
FIG. 9 is a schematic plan view illustrating the structure of an organic EL element according to a first embodiment.
Figure 10:
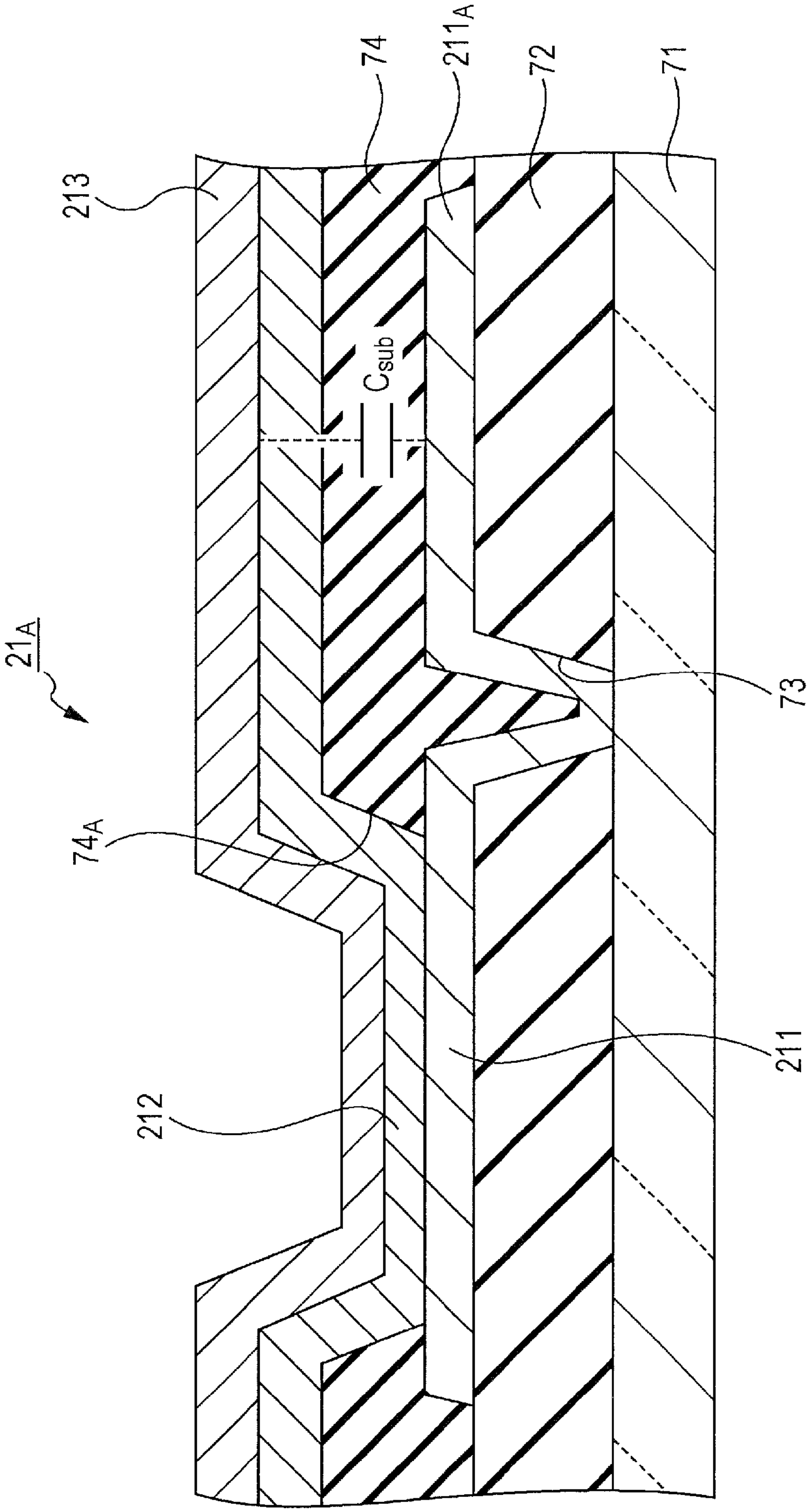
FIG. 10 is a sectional view taken along line X-X in FIG. 9.

The structure of an organic EL element $\mathbf{21}_A$ according to a first embodiment will now be described with reference to FIGS. 9 and 10. FIG. 9 is a schematic plan view showing the structure of the typical organic EL element $\mathbf{21}_A$ according to the first embodiment, except for the cathode electrode and the organic layer. FIG. 10 is a sectional view taken along line X-X in FIG. 9. In FIGS. 9 and 10, portions that are equivalent to those in FIGS. 7 and 8 are denoted by the same reference numerals.

In FIGS. 9 and 10, the basic structure of the organic EL element $21_A$ according to the first embodiment is substantially the same as that of the above-described typical organic EL element $21_x$. That is, the organic EL element $21_A$ according to the first embodiment is constituted by the anode electrode 211 placed at the bottom portion of the depression portion $74_A$ of the window insulating film 74, an organic layer 212 formed on the anode electrode 211, and a cathode electrode 213 (which is common to all pixels) formed on the organic layer 212.

In the organic EL display device 10 according to the present application example, a white organic EL element for emitting white light is used as the organic EL element $21_A$ and a color filter (not shown) is used to obtain emission-light colors of, for example, RGB sub pixels. The white organic EL element may be implemented by, for example, multiple organic EL elements for RGB, more specifically, a tandem-structure organic EL element in which RGB light emitting layers are stacked with connection layers interposed therebetween.

In the organic EL element $21_A$, the region where the organic layer 212 is directly sandwiched between the anode electrode 211 and the cathode electrode 213 is a region that contributes to light emission, i.e., a light emitting section. The anode electrode 211 is formed not only in the region of the light-emitting portion and the region including the contact hole 73 but also in the region that does not contribute to light emission. The portion of the anode electrode 211, the portion being formed in the region that does not contribute to light emission, is hereinafter referred to as an anode electrode $211_A$.

A capacitor that uses the organic layer 212 as a dielectric is formed between the anode electrode 211 and the cathode electrode 213 which oppose each other with the organic layer 212 of the light emitting section interposed therebetween. The size (the capacitance value) of the capacitor in this case is determined by the opposing areas of the anode electrode 211 and the cathode electrode 213 in the light emitting section, the distance between the anode electrode 211 and the cathode electrode 213, and the dielectric constant of the organic layer 212 serving as a dielectric. The capacitor formed in the light emitting section serves as an equivalent capacitor $C_{oled}$ of the organic EL element $21_A$.

In the organic EL element $21_A$ according to the first embodiment, the anode electrode $211_A$ formed in the region that does not contribute to light emission opposes the cathode electrode 213 with the organic layer 212 and the window insulating film 74 being interposed therebetween, as is particularly apparent from FIG. 10. Since the anode electrode $211_A$ and the cathode electrode 213 oppose each other with the organic layer 212 and the window insulating film 74 being interposed therebetween, a capacitor $C_{sub}$ that uses the organic layer 212 and the wind insulating layer 74 as dielectrics is formed between the anode electrode $211_A$ and the cathode electrode 213.

The size (the capacitance value) of the capacitor $C_{sub}$ is determined by the opposing areas of the anode electrode $211_A$ and the cathode electrode 213, the distance between the anode electrode $211_A$ and the cathode electrode 213, and the dielectric constants of the organic layer 212 and the window insulating film 74 serving as dielectrics. The cathode electrode 213 is formed on the entire pixel. The anode electrode $211_A$ is integrally formed with the anode electrode 211 in the light emitting section.

Figure 11A:
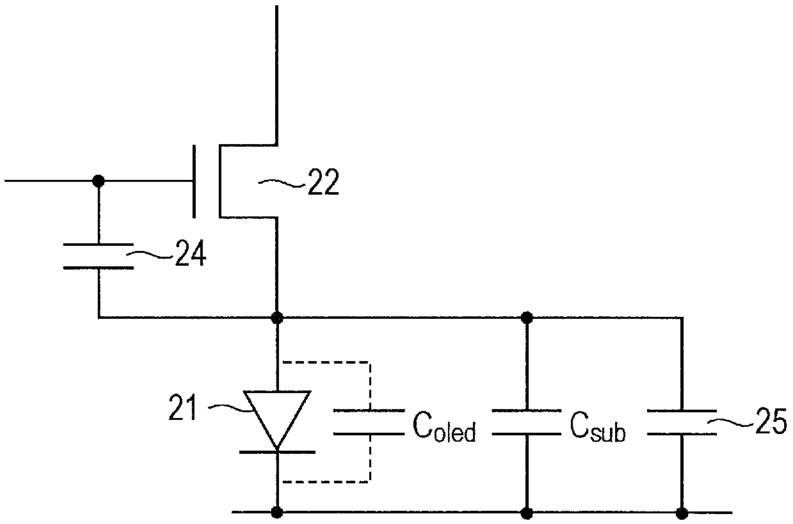
FIGS. 11A and 11B are circuit diagrams each showing an equivalent circuit in which a capacitor formed in a region that does not contribute to light emission is used as a capacitance element in a drive circuit for the organic EL element.

According to the configuration described above, the capacitor formed in the light emitting section, i.e., the equivalent capacitor $C_{oled}$ of the organic EL element $21_A$, and the capacitor $C_{sub}$ formed in the region that does not contribute to light emission are connected in electrical parallel with each other. That is, as shown in the equivalent circuit in FIG. 11A, the capacitor $C_{sub}$ formed in the region that does not contribute to light emission is connected in parallel with the equivalent capacitor $C_{oled}$ of the organic EL element $21_A$ and the auxiliary capacitor 25.

As a result, instead of the auxiliary capacitor 25, the capacitor $C_{sub}$ formed in the region that does not contribute to light emission can be used as a capacitance element that compensates for a shortage of the capacitance of the equivalent capacitor $C_{oled}$ of the organic EL element $21_A$. As a result, the auxiliary capacitor 25 may be eliminated from the pixel 20, in other words, the area corresponding to the layout area in which the auxiliary capacitor 25 is formed in the pixel 20 can be reduced or eliminated. This allows a desired capacitance element (in this example, the capacitor $C_{sub}$ that substitutes for the auxiliary capacitor 25) to be formed in each pixel 20 with a reduced layout area of the pixel 20.

Even when the capacitor $C_{sub}$ formed in the region that does not contribute to light emission does not completely substitute for the auxiliary capacitor 25, the capacitor $C_{sub}$ can be used as an auxiliary capacitance element for the auxiliary capacitor 25. In this case, although the auxiliary capacitor 25 is formed, the size of the auxiliary capacitor 25 can be reduced by an amount corresponding to the presence of the capacitor $C_{sub}$. Thus, even in this case, the layout area of each pixel 20 can be reduced by an amount corresponding to a reduction in the layout area in which the auxiliary capacitor 25 is formed.

As described above, the capacitor $C_{sub}$ formed in the region that does not contribute to light emission can be used singularly or in conjunction with the auxiliary capacitor 25 as a capacitance element for compensating for a shortage of the capacitance of the equivalent capacitor $C_{oled}$ of the organic EL element $21_A$. Thus, it possible to reduce the layout area of each pixel 20. As a result, the size of each pixel 20 can be reduced compared to a case in which the capacitor $C_{sub}$ is not used, thus making it possible to achieve a higher definition of the organic EL display device 10.

[2-3. Structure of Organic EL Element of Second Embodiment]

Figure 12:
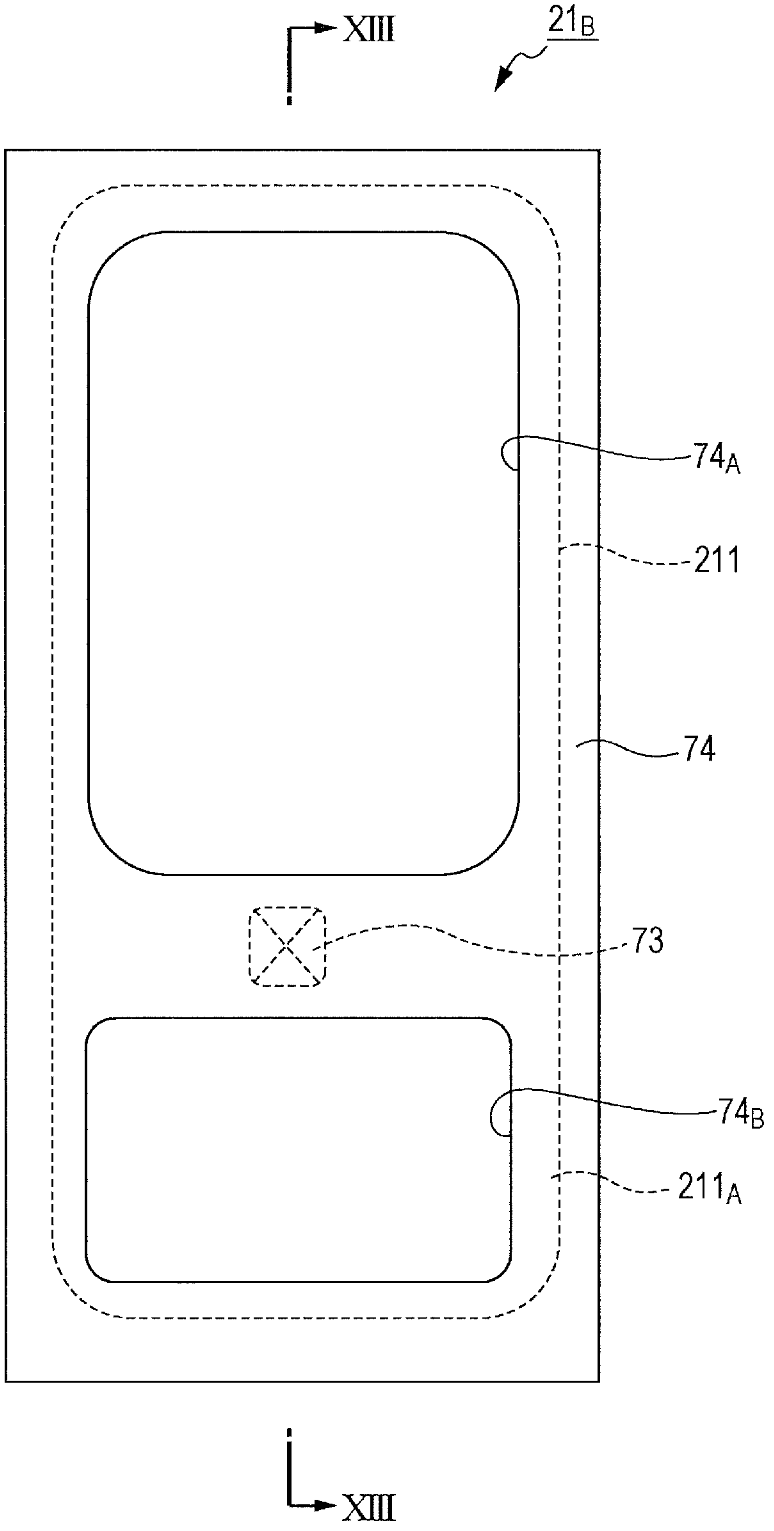
FIG. 12 is a schematic plan view illustrating the structure of an organic EL element according to a second embodiment.
Figure 13:
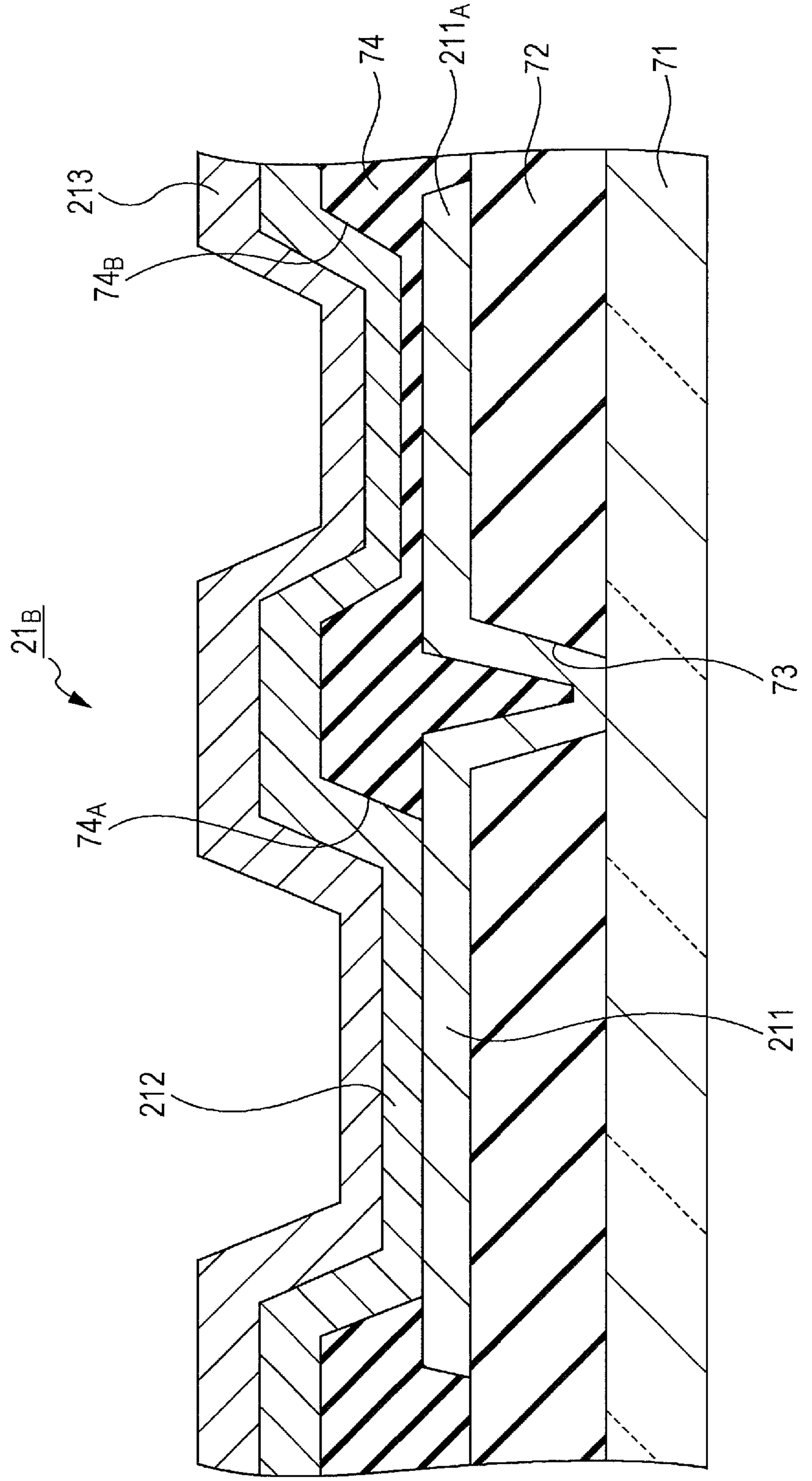
FIG. 13 illustrates a sectional view taken along line XIII-XIII in FIG. 12.

The structure of an organic EL element $21_B$ according to a second embodiment will be described next with reference to FIGS. 12 and 13. FIG. 12 is a schematic plan view showing the structure of the organic EL element $21_B$ according to the second embodiment, except for the cathode electrode and the organic layer. FIG. 13 shows a sectional view taken along line XIII-XIII in FIG. 12. In FIGS. 12 and 13, portions that are equivalent to those in FIGS. 9 and 10 are denoted by the same reference numerals.

The organic EL element $21_B$ according to the second embodiment has substantially the same structure as that of the organic EL element $21_A$ according to the first embodiment. What is different from the organic EL element $21_A$ according to the first embodiment is that the organic EL element $21_B$ has a structure in which the window insulating film 74 in the region that is included in the organic EL element $21_B$ and that does not contribute to light emission and is slightly left so that a depression portion $74_B$ is formed in the left window insulating film 74 and a capacitor $C_{sub}$ is formed in the portion of the depression portion $74_B$.

A halftone mask or the like may be used to form the depression portion $74_B$ in the window insulating film 74. The use of the halftone mask or the like to form the depression portion $74_B$ makes it possible to reduce the film thickness of the window insulating film 74 in the portion where the capacitor $C_{sub}$ is formed. That is, the film thickness of the window insulating film 74 in the region that contributes to the formation of the capacitor $C_{sub}$ is smaller than the film thickness of the window insulating film 74 in the region that does not contribute to the formation of the capacitor $C_{sub}$.

As described above in the first embodiment, the size (the capacitance value) of the capacitor $C_{sub}$ is determined by the opposing areas of the anode electrode $\mathbf{211}_A$ and the cathode electrode 213, the distance between the anode electrode $\mathbf{211}_A$ and the cathode electrode 213, and the dielectric constants of the organic layer 212 and the window insulating film 74. Since the film thickness of the window insulating film 74 at the portion where the capacitor $C_{sub}$ is formed is reduced, the distance between the anode electrode $\mathbf{211}_A$ and the cathode electrode 213 is reduced (shortened).

With this arrangement, since a large capacitor can be formed as the capacitor $C_{sub}$ compared to the case of the first embodiment, the capacitor $C_{sub}$ having the size that is enough to completely substitute for the auxiliary capacitor 25 can be formed. As a result, since the area corresponding to the layout area in which the auxiliary capacitor 25 is formed in the pixel 20 can be reduced or eliminated, the layout area of each pixel 20 can be reduced.

[2-4. Structure of Organic EL Element of Third Embodiment]

Figure 14:
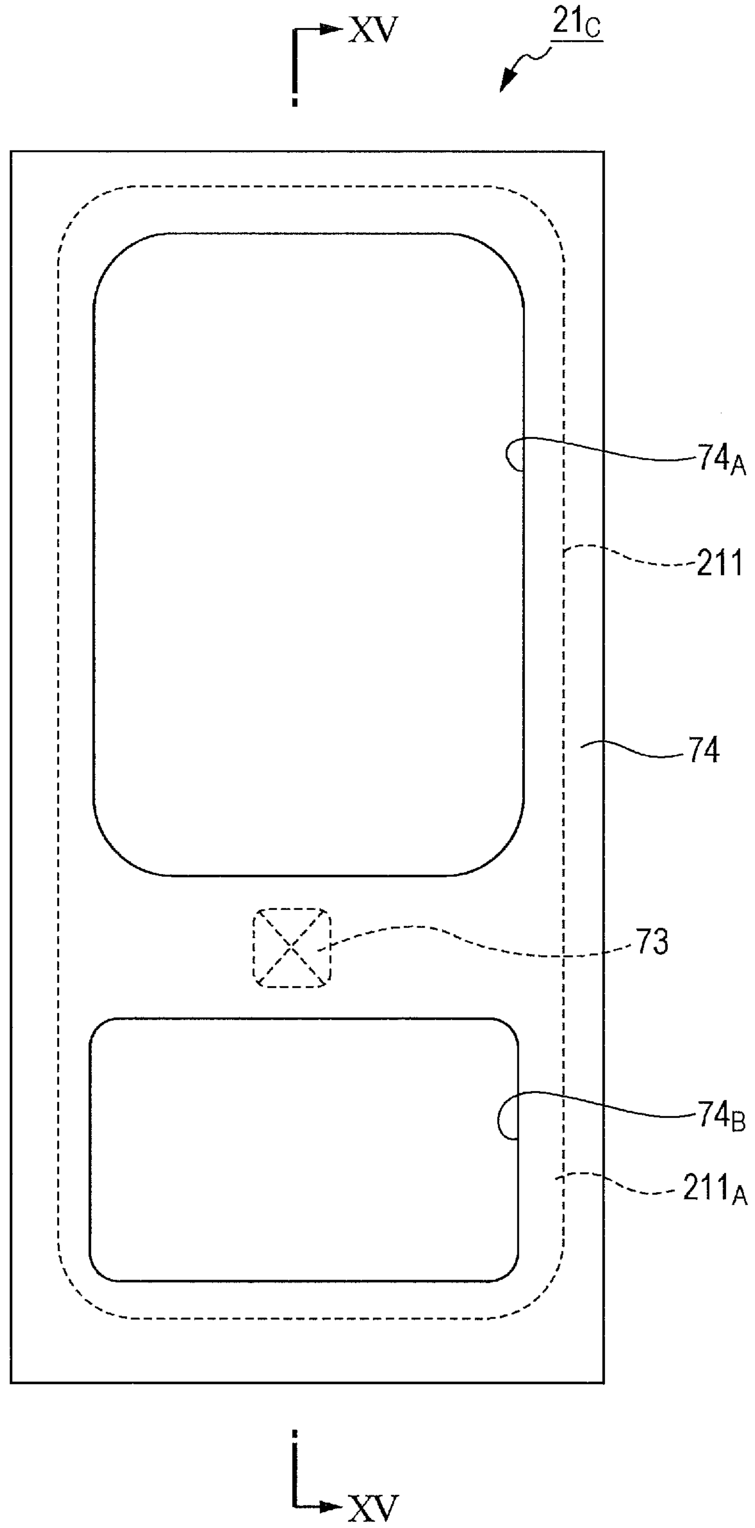
FIG. 14 is a schematic plan view illustrating the structure of an organic EL element according to a third embodiment.
Figure 15:
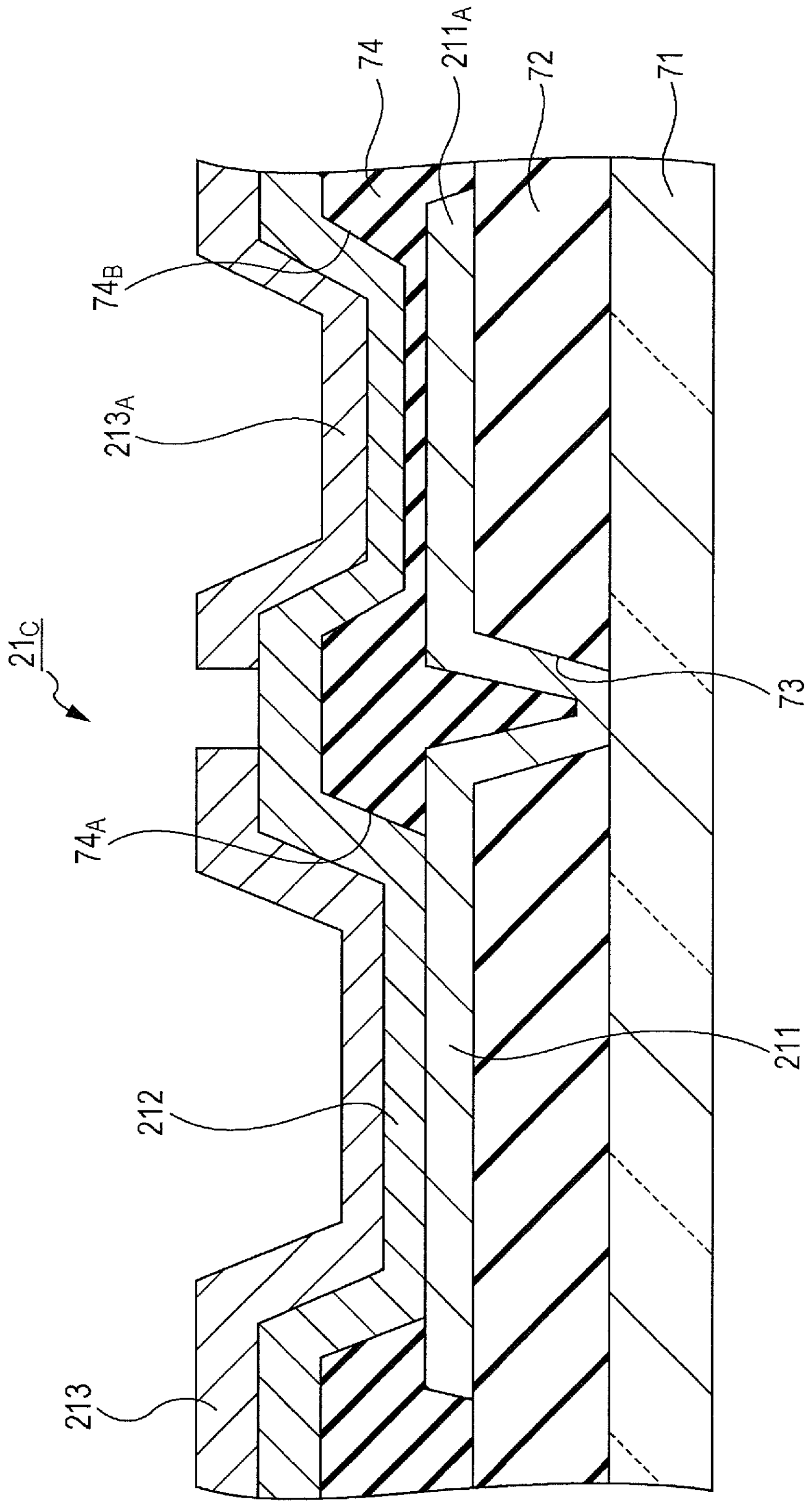
FIG. 15 is a sectional view taken along line XV-XV in FIG. 14.

The structure of an organic EL element $\mathbf{21}_C$ according to a third embodiment will be described next with reference to FIGS. 14 and 15. FIG. 14 is a schematic plan view showing the structure of the organic EL element $\mathbf{21}_C$ according to the third embodiment, except for the cathode electrode and the organic layer. FIG. 15 is a sectional view taken along line XV-XV in FIG. 14. In FIGS. 14 and 15, portions that are equivalent to those in FIGS. 12 and 13 are denoted by the same reference numerals.

The organic EL element $\mathbf{21}_C$ according to the third embodiment has substantially the same structure as that of the organic EL element $\mathbf{21}_B$ according to the second embodiment. What is different from the organic EL element $\mathbf{21}_B$ according to the second embodiment is that the organic EL element $\mathbf{21}_C$ has a structure in which the cathode electrode 213 in the region that is included in the organic EL element $\mathbf{21}_C$ and that does not contribute to light emission is electrically isolated from the region portion of the light emitting section. In the region that does not contribute to light emission, a portion included in the cathode electrode 213 and that is electrically isolated from the region portion in the light emitting section is hereinafter referred to as a "cathode electrode $\mathbf{213}_A$".

The anode electrode $\mathbf{211}_A$ in the region that does not contribute to light emission is integrally formed with the anode electrode 211 in the light emitting section. In contrast, a cathode electrode $\mathbf{213}_A$ in the region that does not contribute to light emission is electrically isolated from the region that contributes to light emission, i.e., the cathode electrode 213 in the light emitting section. With this arrangement, a first electrode of the capacitor $C_{sub}$ formed in the region that does not contribute to light emission is electrically connected to the anode electrode of the organic EL element 21 (i.e., the source electrode of the drive transistor 22), whereas a second electrode of the capacitor $C_{sub}$ is open.

Figure 11B:
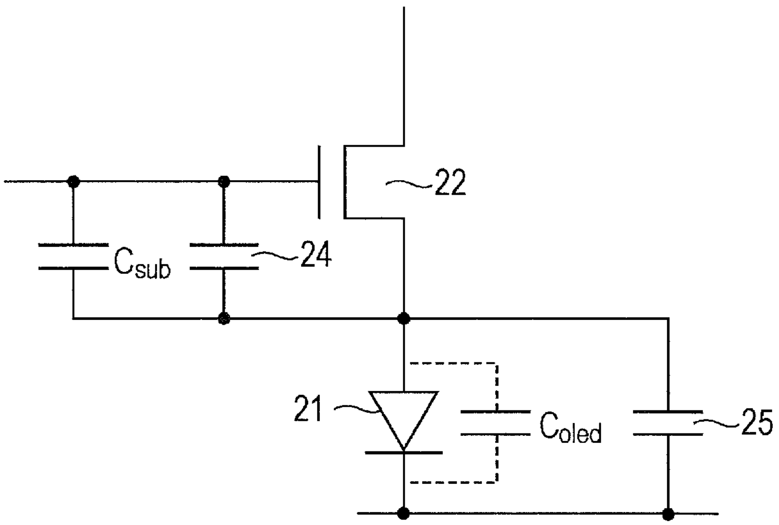

When the second electrode of the capacitor $C_{sub}$ is electrically connected to the gate electrode of the drive transistor 22, as shown in the equivalent circuit in FIG. 11B, the capacitor $C_{sub}$ can be used as an auxiliary capacitor for the storage capacitor 24. With this arrangement, the size of the storage capacitor 24 can be reduced by an amount corresponding to the size (the capacitance value) of the capacitor $C_{sub}$, so that the layout area of each pixel 20 can be reduced by an amount corresponding to the reduction in the layout area in which the storage capacitor 24 is formed.

When the capacitor $C_{sub}$ in the region that does not contribute to light emission can be formed to have a capacitance value that is substantially equal to the capacitance value of the storage capacitor 24, the capacitor $C_{sub}$ can also be used instead of the storage capacitor 24. In this case, since the layout area in which the storage capacitor 24 is formed may be completely eliminated, the layout area of each pixel 20 can be further reduced compared to a case in which the storage capacitor 24 is used as the auxiliary capacitor.

When a configuration in which the same potential as the cathode potential $V_{cath}$ of the organic EL element 21 is applied to the second electrode of the capacitor $C_{sub}$ is employed, the capacitor $C_{sub}$ can be used singularly or in conjunction with the auxiliary capacitor 25 as a capacitance element for compensating for a shortage of the capacitance of the equivalent capacitor $C_{oled}$ of the organic EL element $\mathbf{21}_A$, as in the case of the first embodiment. In such a case, the layout area of each pixel 20 can also be reduced.

[2-5. Structure of Organic EL Element of Fourth Embodiment]

Figure 16:
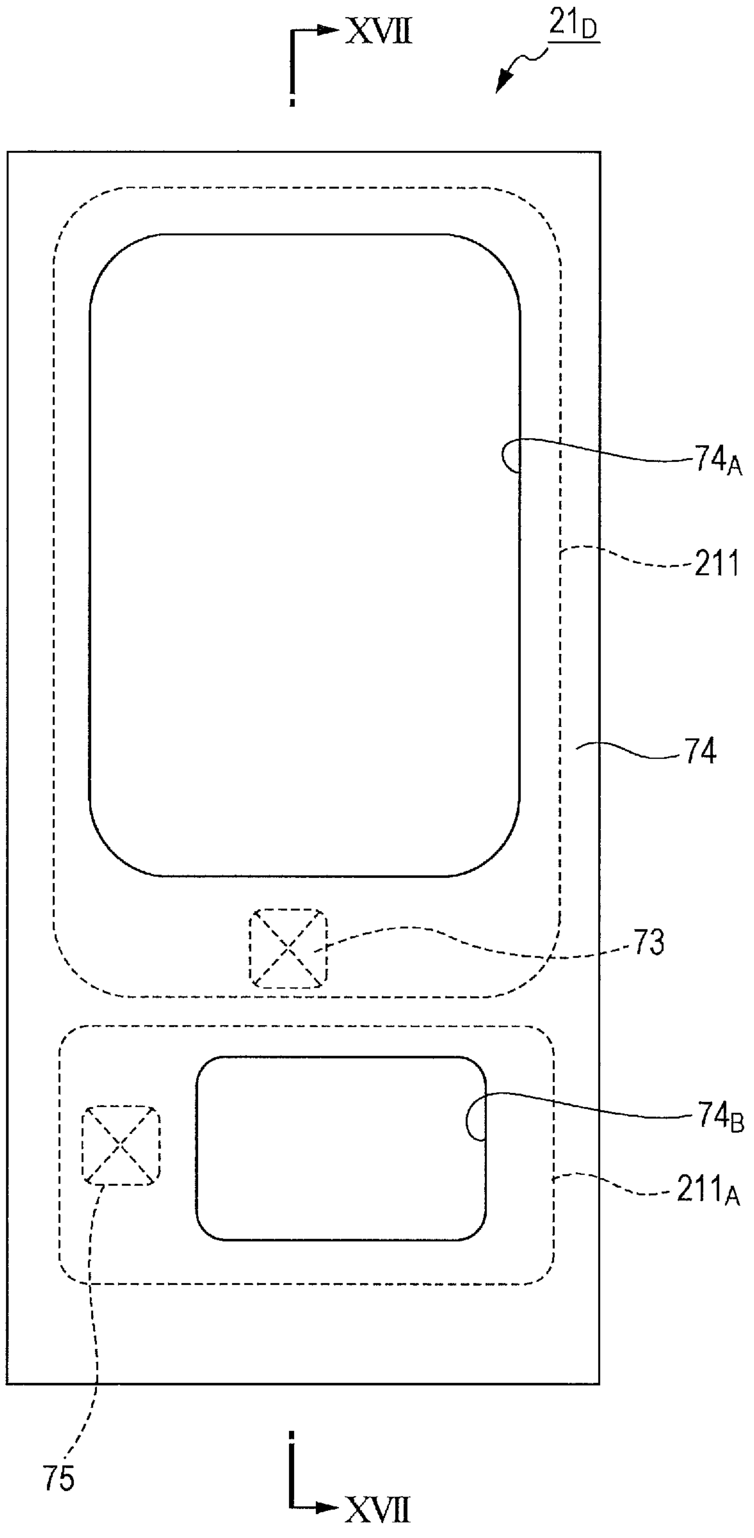
FIG. 16 is a schematic plan view illustrating the structure of an organic EL element according to a fourth embodiment.
Figure 17:
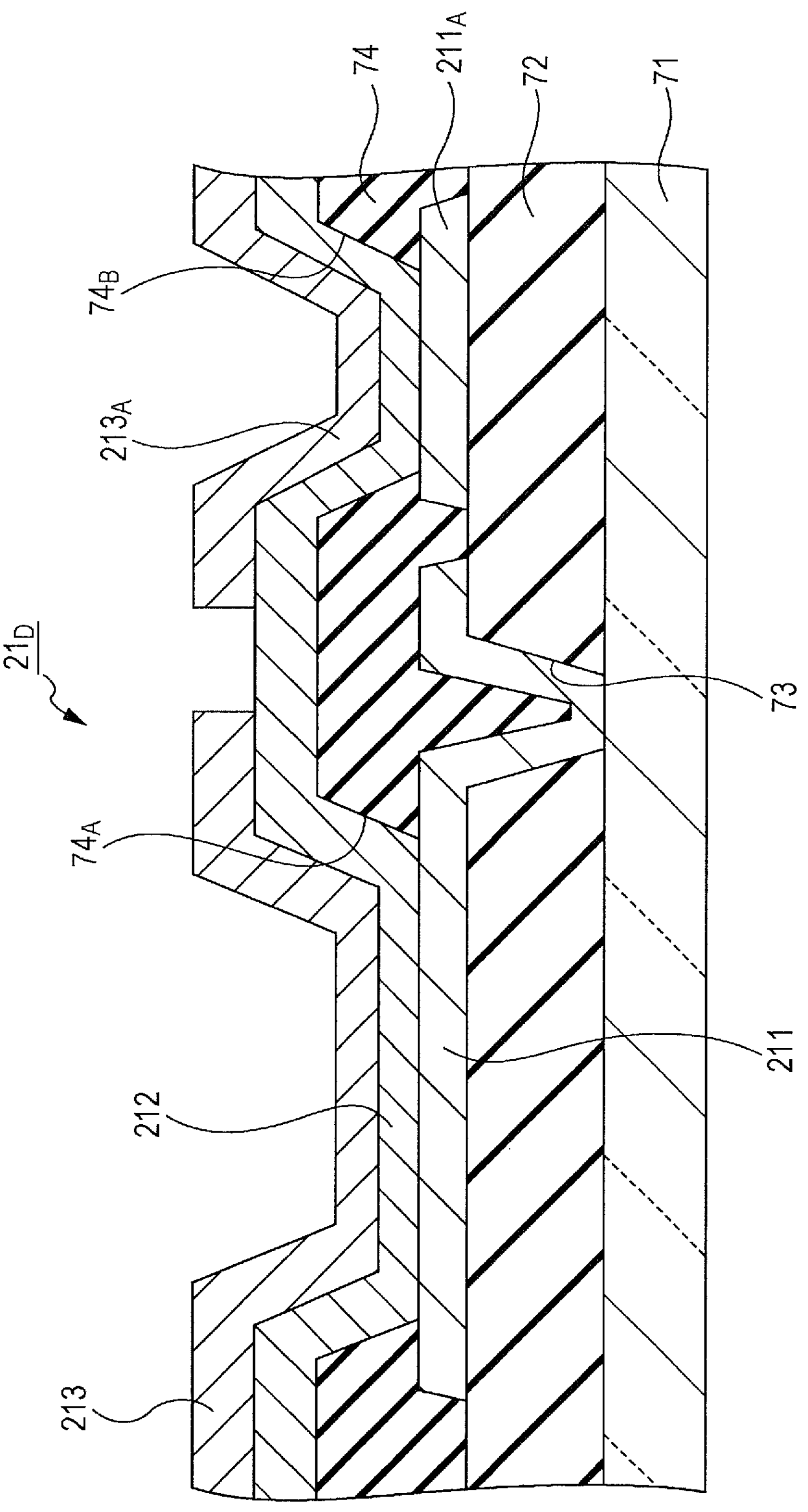
FIG. 17 is a sectional view taken along line XVII-XVII in FIG. 16.

The structure of an organic EL element $\mathbf{21}_D$ according to a fourth embodiment will be described next with reference to FIGS. 16 and 17. FIG. 16 is a schematic plan view showing the structure of the organic EL element $\mathbf{21}_D$ according to the fourth embodiment, except for the cathode electrode and the organic layer. FIG. 17 is a sectional view taken along line XVII-XVII in FIG. 16. In FIGS. 16 and 17, portions that are equivalent to those in FIGS. 14 and 15 are denoted by the same reference numerals.

As described above, the organic EL element $\mathbf{21}_C$ according to the third embodiment has a structure in which the cathode electrode $\mathbf{213}_A$ in the region that does not contribute to light emission is electrically isolated from the region that contributes to light emission, i.e., the cathode electrode 213 in the light emitting section. In contrast, the organic EL element $\mathbf{21}_D$ according to the fourth embodiment has a structure in which the anode electrode $\mathbf{211}_A$ in the region that does not contribute to light emission, in addition to the cathode electrode $\mathbf{213}_A$, is also electrically isolated from the region that contributes to light emission, i.e., the anode electrode 211 in the light emitting section.

That is, both of the electrodes of the capacitor $C_{sub}$ that is formed in the region that does not contribute to light emission are open. Thus, when the capacitor $C_{sub}$ formed in the region that does not contribute to light emission is connected to have a connection relationship shown in FIG. 11A, the capacitor $C_{sub}$ can be used singularly or in conjunction with the auxiliary capacitor 25 as a capacitance element for compensating for a shortage of the capacitance of the equivalent capacitor $C_{oled}$ of the organic EL element $\mathbf{21}_A$, as in the case of the first embodiment.

When the capacitor $C_{sub}$ formed in the region that does not contribute to light emission is connected to have a connection relationship shown in FIG. 11B, the capacitor $C_{sub}$ can be used as an auxiliary capacitor for the storage capacitor 24 or a capacitance element that substitutes for the storage capacitor 24, as in the case of the third embodiment. In addition, when the drive circuit for the organic EL element 21 has a circuit configuration having another capacitance element in addition to the elements in the circuit configuration shown in FIG. 2, the capacitance element may also be implemented by the capacitor $C_{sub}$ formed in the region that does not contribute to light emission.

3. APPLICATION EXAMPLES

The above embodiments have been described in conjunction with an example in which the drive circuit (the pixel circuit) for driving the organic EL element 21 has two capacitance elements, i.e., the storage capacitor 24 and the auxiliary capacitor 25, the circuit configuration of the drive circuit is not limited to the particular example.

That is, the present disclosure is applicable to any organic EL display device having a circuit configuration including at least one capacitance element. Examples include a circuit configuration in which the drive circuit has one capacitance element, i.e., the storage capacitor 24, or a circuit configuration in which the drive circuit has another capacitance element in addition to the storage capacitor 24 and the auxiliary capacitor 25. In addition, with respect to the transistors included in the drive circuit, the present disclosure is also applicable to an organic EL display device having a circuit configuration having another transistor in addition to the drive transistor 22 and the write transistor 23.

4. ELECTRONIC APPARATUSES

The above-described organic EL display device according to one embodiment of the present disclosure is applicable to display units (display devices) for electronic apparatuses in any fields in which video signals input to the electronic apparatuses or video signals generated thereby are displayed in the form of images or video. For example, the present disclosure is applicable to display units for various types of electronic apparatus, such as a television set, a digital camera, a video camera, a notebook personal computer, and a mobile terminal device such as a mobile phone, as shown in FIGS. 18 to 22G.

Thus, the use of the organic EL display device according to one embodiment of the present disclosure as a display unit for an electronic apparatus in any field makes it possible to enhance the display quality of the electronic apparatus. That is, as is apparent from the description of the above embodiments, the organic EL display device according to one embodiment of the present disclosure allows the layout areas of the pixels to be reduced when the capacitance elements are formed in the pixels, thus making it possible to achieve a higher definition. Accordingly, it is possible to provide various electronic apparatuses that realize high-quality, favorable display images.

The display device according to one embodiment of the present disclosure may also be implemented by a modular form having a sealed structure. The modular form corresponds to, for example, the display module formed by laminating the opposing portions, made of the transparent glass or the like, to the pixel array section. The display module may also be provided with, for example, an FPC (flexible printed circuit) or a circuit section for externally inputting/outputting a signal and so on to/from the pixel array section.

Specific examples of an electronic apparatus to which an embodiment of the present disclosure is applied will be described below.

Figure 18:
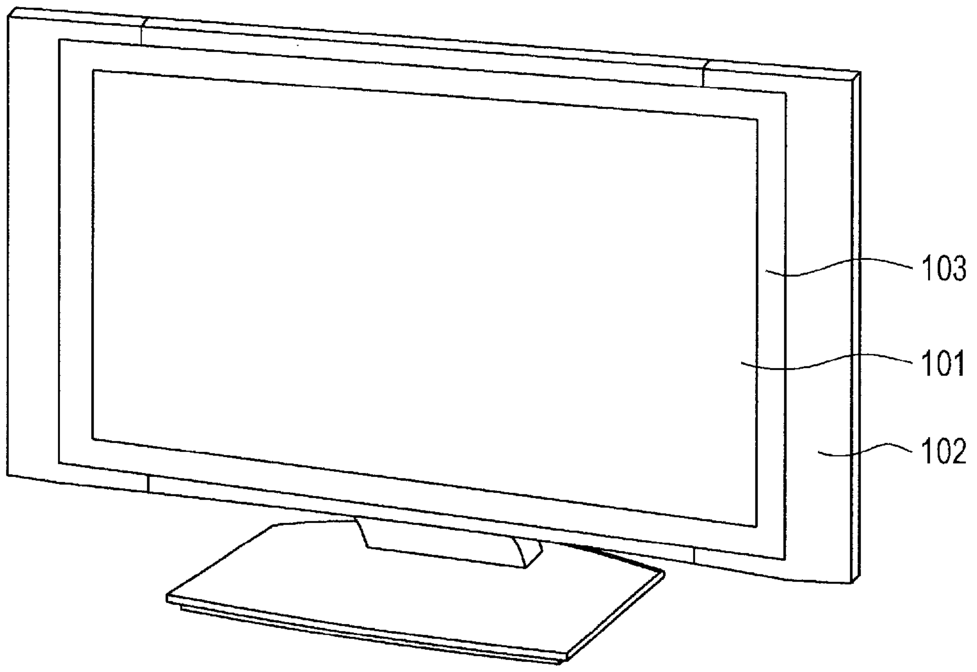
FIG. 18 is a perspective view showing the external appearance of a television set to which an embodiment of the present disclosure is applied.

FIG. 18 is a perspective view showing the external appearance of a television set to which an embodiment of the present disclosure is applied. The television set according to the application example includes a video display screen section 101 having a front panel 102, a filter glass 103, and so on. The television set is manufactured by using the organic EL display device according to the present application example as the video display screen section 101.

Figure 19A:
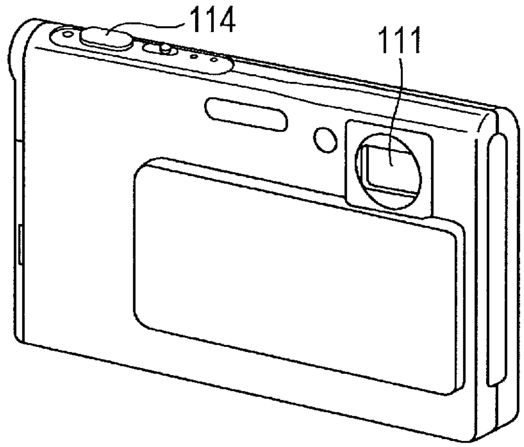
FIGS. 19A and 19B are a front perspective view and a rear perspective view, respectively, showing the external appearance of a digital camera to which an embodiment of the present disclosure is applied.
Figure 19B:
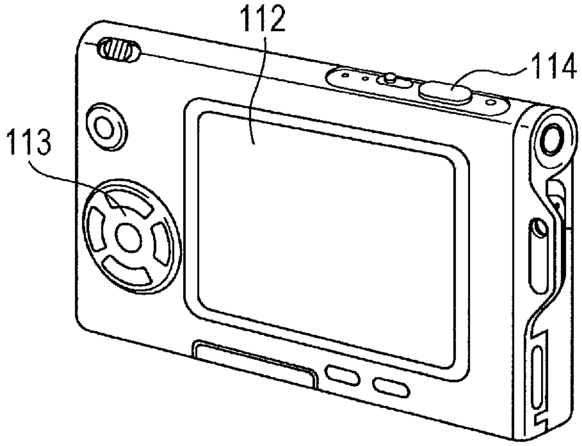

FIGS. 19A and 19B are a front perspective view and a rear perspective view, respectively, showing the external appearance of a digital camera to which an embodiment of the present disclosure is applied. The digital camera according to the application example includes a flashlight emitting section 111, a display section 112, a menu switch 113, a shutter button 114, and so on. The digital camera is manufactured using the display device according to the present application example as the display section 112.

Figure 20:
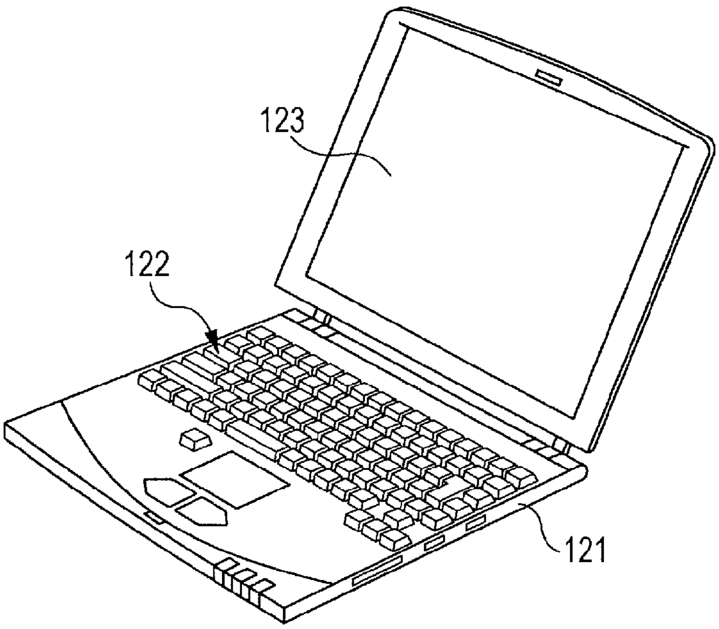
FIG. 20 is a perspective view showing the external appearance of a notebook personal computer to which an embodiment of the present disclosure is applied.

FIG. 20 is a perspective view showing the external appearance of a notebook personal computer to which an embodiment of the present disclosure is applied. The notebook personal computer according to the present application example has a configuration in which a main unit 121 includes a keyboard 122 for operation for inputting characters and so on, a display section 123 for displaying an image, and so on. The notebook personal computer is manufactured using the organic EL display device according to one embodiment of the present disclosure as the display section 123.

Figure 21:
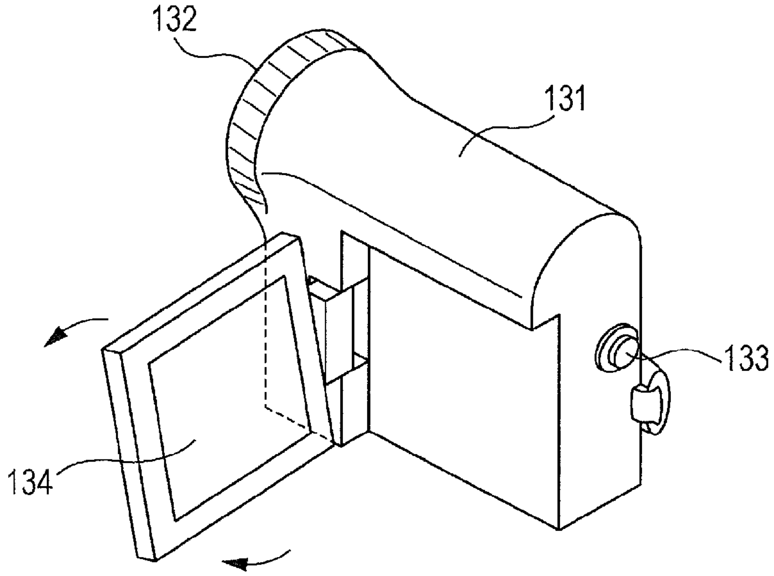
FIG. 21 is a perspective view showing the external appearance of a video camera to which an embodiment of the present disclosure is applied.

FIG. 21 is a perspective view showing the external appearance of a video camera to which an embodiment of the present disclosure is applied. The video camera according to the present application example includes a main unit 131, a subject-shooting lens 132 provided at a front side surface thereof, a start/stop switch 133 for shooting, a display section 134, and so on. The video camera is manufactured using the organic EL display device according to one embodiment of the present disclosure as the display section 134.

Figures 22A, 22B, 22C, 22D, 22E, 22F, 22G:
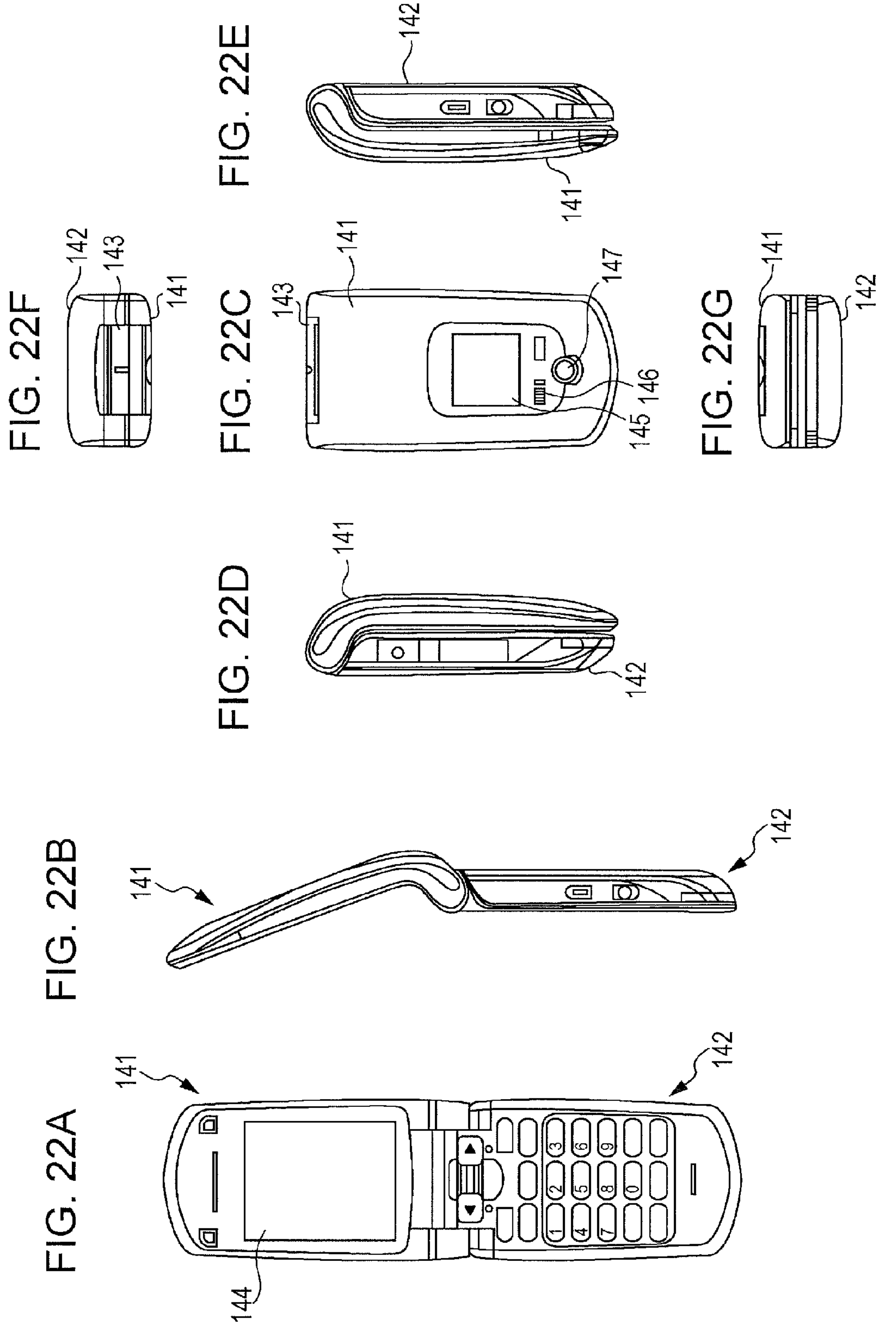
FIGS. 22A to 22G are external views of a mobile phone to which the present embodiment is applied, FIG. 22A being a front view of the mobile phone when it is opened, FIG. 22B being a side view thereof, FIG. 22C being a front view when the mobile phone is closed, FIG. 22D being a left side view, FIG. 22E being a right side view, FIG. 22F being a top view, and FIG. 22G being a bottom view.

FIGS. 22A to 22G are external views of a mobile terminal device, for example, a mobile phone, to which an embodiment of the present disclosure is applied. Specifically, FIG. 22A is a front view of the mobile phone when it is opened, FIG. 22B is a side view thereof, FIG. 22C is a front view when the mobile phone is closed, FIG. 22D is a left side view, FIG. 22E is a right side view, FIG. 22F is a top view, and FIG. 22G is a bottom view. The mobile phone according to the present application example includes an upper casing 141, a lower casing 142, a coupling portion (a hinge portion, in this case) 143, a display 144, a sub display 145, a picture light 146, a camera 147, and so on. The mobile phone is manufactured using the organic EL display device according to the present application example as the display 144 and/or the sub display 145.

The present disclosure contains subject matter related to that disclosed in Japanese Priority Patent Application JP 2011-000942 filed in the Japan Patent Office on Jan. 6, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent display device comprising:

organic electroluminescent elements provided for respective pixels, at least one of the organic electroluminescent elements having first and second electrodes between which an organic layer is provided and having a region that contributes to light emission and a region that does not contribute to light emission, wherein a first capacitor is formed between the first and second electrodes in the region that does not contribute to light emission and, the first and second electrodes being configured such that the first capacitor is a capacitance element in a drive circuit for the organic electroluminescent element, wherein the drive circuit comprises:

a write transistor that writes a signal voltage of a video signal to the corresponding pixel;

a second capacitor that stores at least a portion of the signal voltage written by the write transistor; and a drive transistor that drives the organic electroluminescent element in accordance with the voltage stored by at least the second capacitor, and wherein a first terminal of the first capacitor is connected to the first electrode and a second terminal of the first capacitor is connected to a gate electrode of the drive transistor.

2. The organic electroluminescent display device according to claim 1, wherein the first electrode has an electrode portion in the region that does not contribute to light emission and an electrode portion in the region that contributes to light emission, the electrode portion in the region that does not contribute to light emission being isolated from the electrode portion in the region that contributes to light emission.

3. The organic electroluminescent display device according to claim 2, wherein the first electrode is a cathode electrode.

4. The organic electroluminescent display device according to claim 3, wherein the second electrode is an anode electrode and has an electrode portion in the region that does not contribute to light emission and an electrode portion in the region that contributes to light emission, the electrode portion in the region that does not contribute to light emission being isolated from the electrode portion in the region that contributes to light emission.

5. The organic electroluminescent display device according to claim 1, wherein the organic electroluminescent element has an insulating film provided between the first and second electrodes in the region that does not contribute to light emission, a film thickness of the insulating film provided between the first and second electrodes in a region that contributes to a formation of the first capacitor being smaller than a film thickness of the insulating film provided between the first and second electrodes in a region that does not contribute to the formation of the first capacitor.

6. The organic electroluminescent display device according to claim 5, wherein the insulating film provided between the first and second electrodes in the region that contributes to the formation of the first capacitor is reduced using a halftone mask.

7. The organic electroluminescent display device according to claim 1, wherein the first capacitor is connected in parallel with the organic electroluminescent element and is used as an auxiliary of the equivalent capacitor of the organic electroluminescent element.

8. The organic electroluminescent display device according to claim 1, wherein the first capacitor is connected in parallel with the second capacitor and is used as an auxiliary of the second capacitor.

9. The organic electroluminescent display device according to claim 1, wherein the first capacitor is connected between the gate electrode and one source/drain electrode of the drive transistor and is used as a storage capacitor.

10. The organic electroluminescent display device according to claim 1, wherein the drive circuit further includes an auxiliary capacitor that compensates for a shortage of capacitance of an equivalent capacitor of the organic electroluminescent element, and the first capacitor is connected in parallel with the auxiliary capacitor and is used as an auxiliary of the auxiliary capacitor.

11. The organic electroluminescent display device according to claim 1, wherein the first capacitor is connected in parallel with the organic electroluminescent element and is used as the auxiliary capacitor.

12. An electronic apparatus comprising:

an organic electroluminescent display device that includes organic electroluminescent elements provided for respective pixels, at least one of the organic electroluminescent elements having first and second electrodes between which an organic layer is provided and having a region that contributes to light emission and a region that does not contribute to light emission, wherein a first capacitor is formed between the first and second electrodes in the region that does not contribute to light emission and, the first and second electrodes being configured such that the first capacitor is a capacitance element in a drive circuit for the organic electroluminescent element wherein the drive circuit further comprises:

a write transistor that writes a signal voltage of a video signal to the corresponding pixel;

a second capacitor that stores at least a portion of the signal voltage written by the write transistor; and a drive transistor that drives the organic electroluminescent element in accordance with the voltage stored by at least the second capacitor, and wherein a first terminal of the first capacitor is connected to the first electrode and a second terminal of the first capacitor is connected to a gate electrode of the drive transistor.

13. The electronic apparatus according to claim 12, wherein the first electrode has an electrode portion in the region that does not contribute to light emission and an electrode portion in the region that contributes to light emission, the electrode portion in the region that does not contribute to light emission being isolated from the electrode portion in the region that contributes to light emission.

14. The electronic apparatus according to claim 13, wherein the first electrode is a cathode electrode.

15. The electronic apparatus according to claim 14, wherein the second electrode is an anode electrode and has an electrode portion in the region that does not contribute to light emission and an electrode portion in the region that contributes to light emission, the electrode portion in the region that does not contribute to light emission being isolated from the electrode portion in the region that contributes to light emission.

16. The electronic apparatus according to claim 12, wherein the organic electroluminescent element has an insulating film provided between the first and second electrodes in the region that does not contribute to light emission, a film thickness of the insulating film provided between the first and second electrodes in a region that contributes to a formation of the first capacitor being smaller than a film thickness of the insulating film provided between the first and second electrodes in a region that does not contribute to the formation of the first capacitor.

17. The electronic apparatus according to claim 12, wherein the organic electroluminescent elements include white organic electroluminescent elements, and colors of at least some of the respective pixels are provided by color filters.

18. The electronic apparatus according to claim 12, wherein the organic electroluminescent elements include at least one tandem-structure organic electroluminescent element that includes at least a first light emitting layer having a first color and a second light emitting layer having a second color that differs from the first color, such that the tandem-structure organic electroluminescent element produces a white color for its respective pixel.

19. The organic electroluminescent display device according to claim 1, wherein the organic electroluminescent elements include white organic electroluminescent elements, and colors of at least some of the respective pixels are provided by color filters.

20. The organic electroluminescent display device according to claim 1, wherein the organic electroluminescent elements include at least one tandem-structure organic electroluminescent element that includes at least a first light emitting layer having a first color and a second light emitting layer having a second color that differs from the first color, such that the tandem-structure organic electroluminescent element produces a white color for its respective pixel.

* * * * *